(12) United States Patent
Rabkin et al.

(10) Patent No.: US 9,177,966 B1
(45) Date of Patent: Nov. 3, 2015

(54) THREE DIMENSIONAL NAND DEVICES WITH AIR GAP OR LOW-K CORE

(71) Applicant: SANDISK TECHNOLOGIES INC., Plano, TX (US)

(72) Inventors: Peter Rabkin, Cupertino, CA (US); Wei Zhao, Milpitas, CA (US); Yanli Zhang, San Jose, CA (US); Jayavel Pachamuthu, Milpitas, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/326,298

(22) Filed: Jul. 8, 2014

(51) Int. Cl.
| | |
|---|---|
| *H01L 21/336* | (2006.01) |
| *H01L 29/76* | (2006.01) |
| *H01L 27/115* | (2006.01) |
| *H01L 29/788* | (2006.01) |

(Continued)

(52) U.S. Cl.
CPC .... *H01L 27/11582* (2013.01); *H01L 21/02118* (2013.01); *H01L 21/02164* (2013.01); *H01L 21/02203* (2013.01); *H01L 21/02532* (2013.01); *H01L 21/02598* (2013.01); *H01L 21/28273* (2013.01); *H01L 21/28282* (2013.01); *H01L 21/31111* (2013.01); *H01L 27/11521* (2013.01); *H01L 27/11556* (2013.01); *H01L 27/11568* (2013.01); *H01L 29/7883* (2013.01); *H01L 29/7926* (2013.01)

(58) Field of Classification Search
CPC ............. H01L 27/1157; H01L 27/11582; H01L 27/11556; H01L 27/11521; H01L 27/11568; H01L 29/7926

USPC .......... 438/268, 269, 270, 272; 257/328, 329, 257/330, 331
See application file for complete search history.

(56) References Cited

U.S. PATENT DOCUMENTS

| | | |
|---|---|---|
| 5,915,167 A | 6/1999 | Leedy |
| 7,005,350 B2 | 2/2006 | Walker et al. |

(Continued)

FOREIGN PATENT DOCUMENTS

WO WO02/15277 A1 2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Kevin M Picardat
(74) *Attorney, Agent, or Firm* — The Marbury Law Group PLLC

(57) ABSTRACT

A monolithic three dimensional NAND string device includes a semiconductor channel, at least one end portion of the semiconductor channel extending substantially perpendicular to a major surface of a substrate, a plurality of control gate electrodes extending substantially parallel to the major surface of the substrate in different device levels, a blocking dielectric located in contact with the plurality of control gate electrodes, at least one charge storage region located in contact with the blocking dielectric, and a tunnel dielectric located between the at least one charge storage region and the semiconductor channel. The semiconductor channel is a hollow body surrounding a middle region and at least one of an air gap or a low-k insulating material having a dielectric constant of less than 3.9 is located in the middle region.

37 Claims, 19 Drawing Sheets

(51) Int. Cl.
*H01L 29/792* (2006.01)
*H01L 21/311* (2006.01)
*H01L 21/02* (2006.01)
*H01L 21/28* (2006.01)

(56) References Cited

U.S. PATENT DOCUMENTS

| | | | |
|---|---|---|---|
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,349,681 B2 | 1/2013 | Alsmeier et al. | |
| 8,658,499 B2 | 2/2014 | Makala et al. | |
| 8,872,252 B2 * | 10/2014 | Jindal et al. | 257/321 |
| 8,951,865 B2 * | 2/2015 | Goda | 438/268 |
| 2007/0210338 A1 | 9/2007 | Orlowski | |
| 2007/0252201 A1 | 11/2007 | Kito et al. | |
| 2009/0242967 A1 | 10/2009 | Katsumata et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho et al. | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0198687 A1 | 8/2011 | Lee | |
| 2011/0266606 A1 | 11/2011 | Park et al. | |
| 2011/0280077 A1 | 11/2011 | Fishburn | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0092926 A1 | 4/2012 | Whang et al. | |
| 2012/0146122 A1 | 6/2012 | Whang et al. | |
| 2013/0264631 A1 | 10/2013 | Alsmeier et al. | |
| 2013/0313627 A1 | 11/2013 | Lee et al. | |
| 2014/0131787 A1 * | 5/2014 | Alsmeier | 257/321 |
| 2014/0138760 A1 | 5/2014 | Makala et al. | |
| 2014/0246716 A1 * | 9/2014 | Sinha | 257/315 |
| 2015/0140753 A1 * | 5/2015 | Simsek-Ege et al. | 438/268 |
| 2015/0179660 A1 * | 6/2015 | Yada et al. | 257/321 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) pp. 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M., "3D Cells Make Terabit NAND Flash Possible," Nikkei Electronics Asia, Sep. 17, 2009, 6pgs.

International Search Report and Written Opinion, International Application No. PCT/US2011/042566, issued Jan. 17, 2012.

Invitation to Pay Additional Fees & Partial International Search Report, PCT/US2011/042566, issued Sep. 28, 2011.

Chen et al., "Reliability Characteristics of NiSi Nanocrystals Embedded in Oxide and Nitride Layers for Nonvolatile Memory Application," Applied Physics Letters, 92, 152114 (2008).

Invitation to Pay Additional Search Fees, International Application No. PCT/2013/048508, issued Sep. 18, 2013.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

International Search Report and Written Opinion, International Application No. PCT/US2013/048508, issued Dec. 18, 2013.

Chen et al., "Formation of $NiSi_2/SiN_x$ Compound Nanocrystal for Nonvolatile Memory Application," Thin Solid Films, Elsevier-Sequoia S.A., Lausanne, Switzerland, vol. 518, No. 24, pp. 7324-7327 (2010).

Diaz, "Low-$k$ Dielectrics: Materials and Process Technology," EE518, Penn State University, Apr. 13, 2006.

Saraswat, "Low-$k$ Dielectrics," Department of Electrical Engineering, Stanford University, Jul. 2008.

* cited by examiner

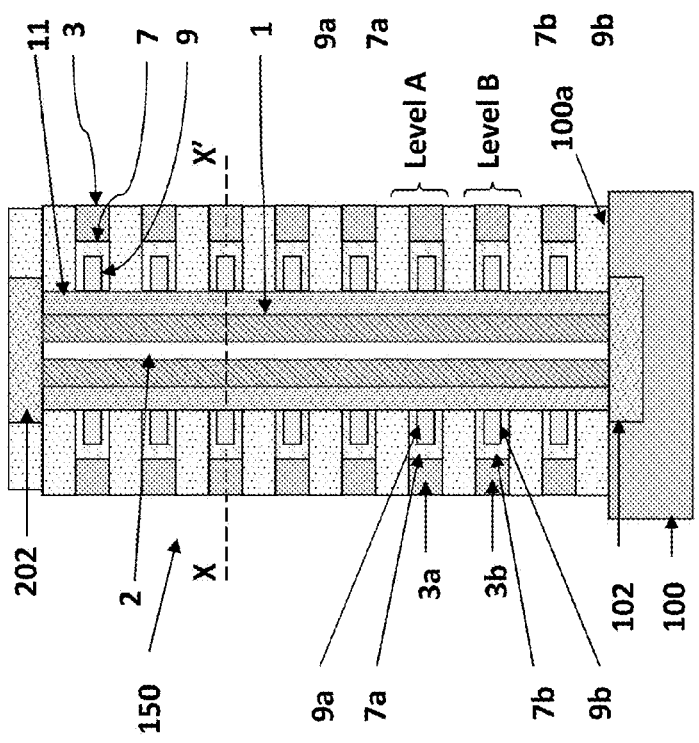
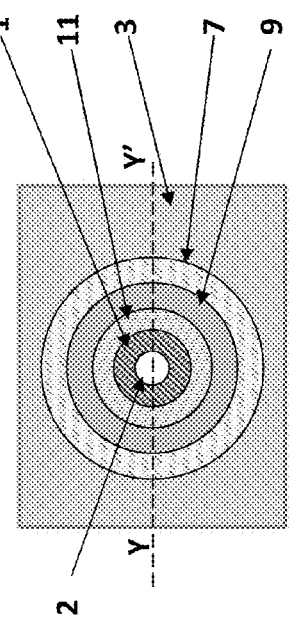
Fig. 1A
Fig. 1B

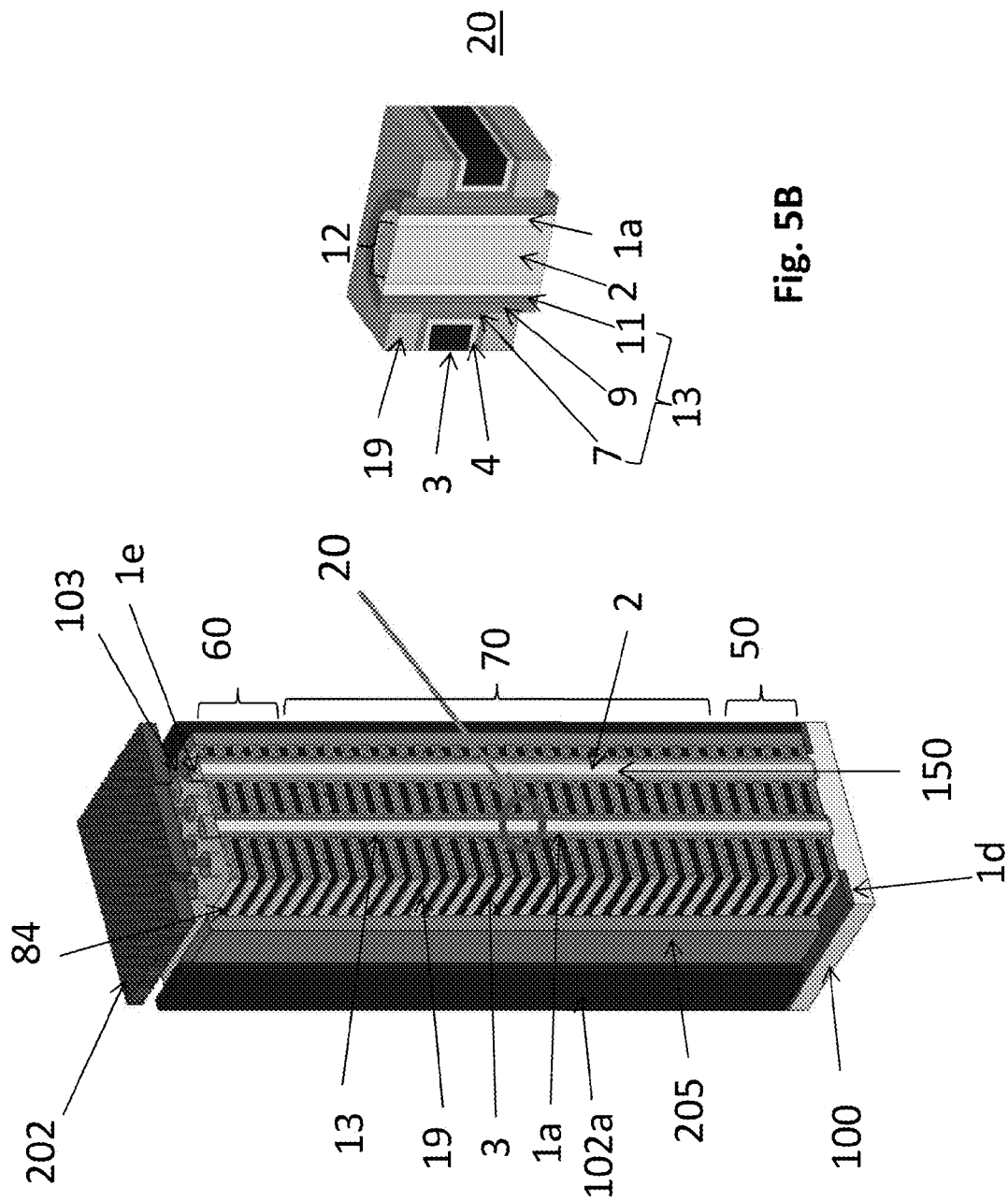

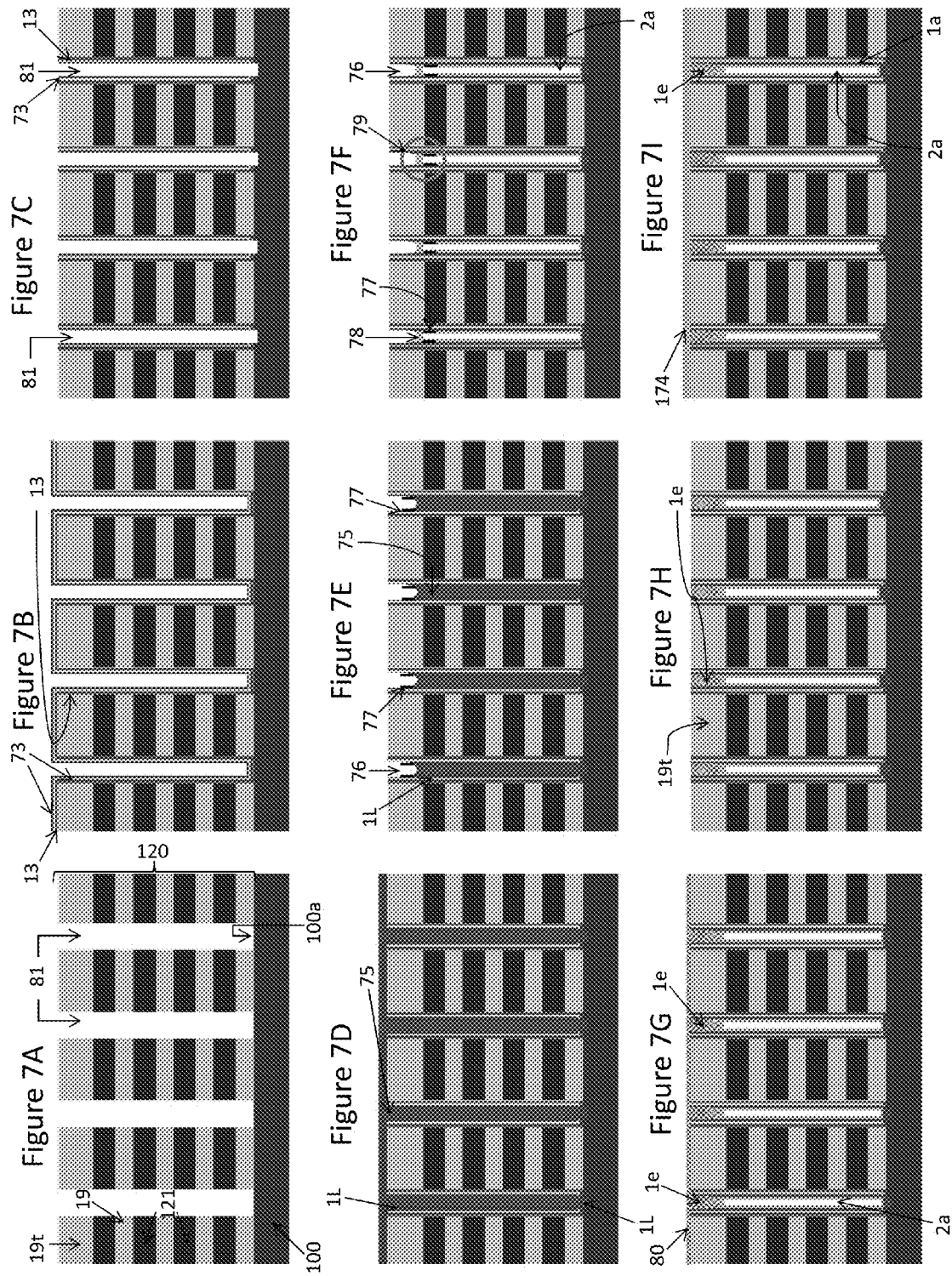

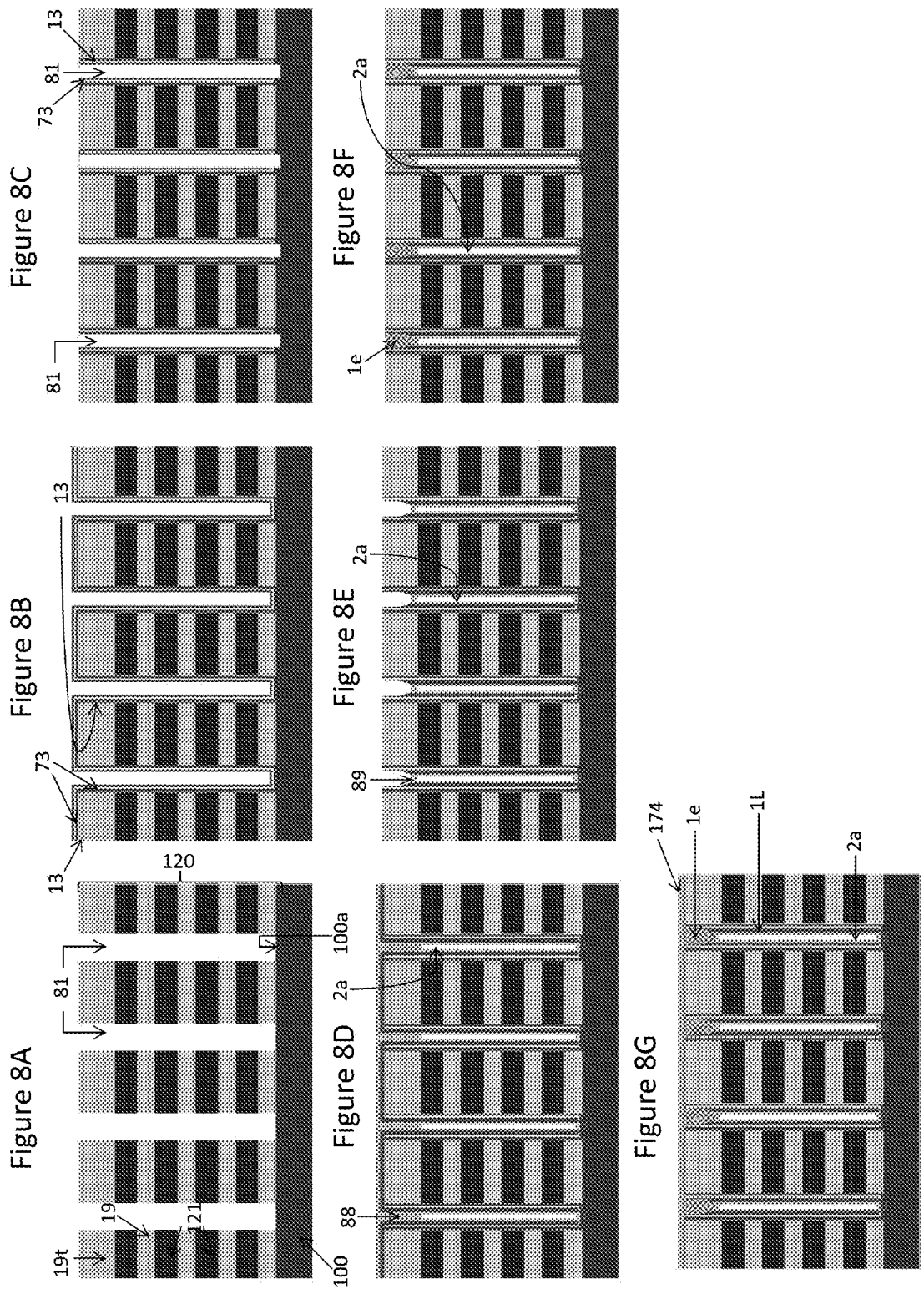

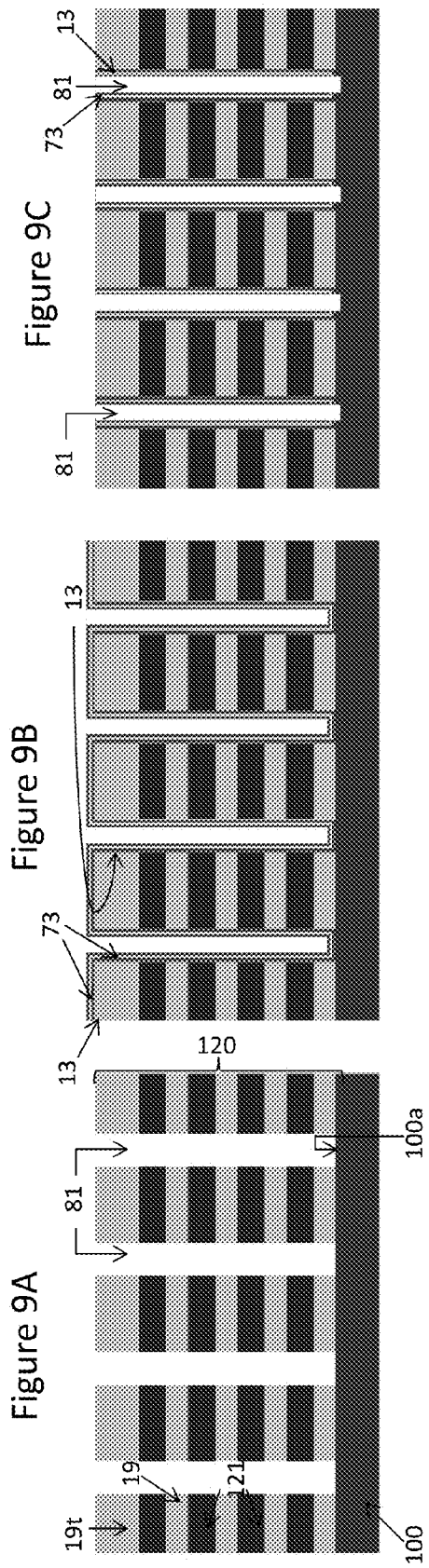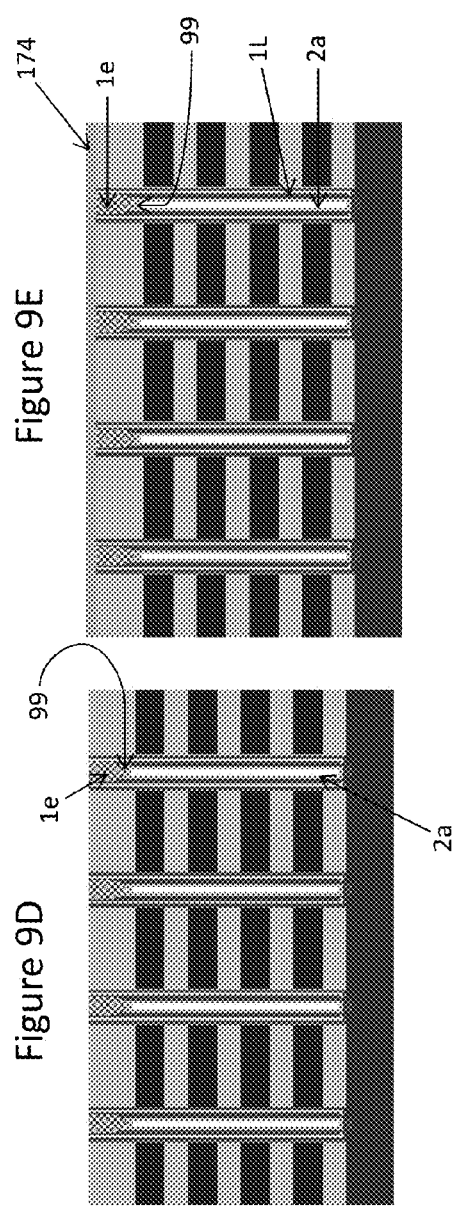

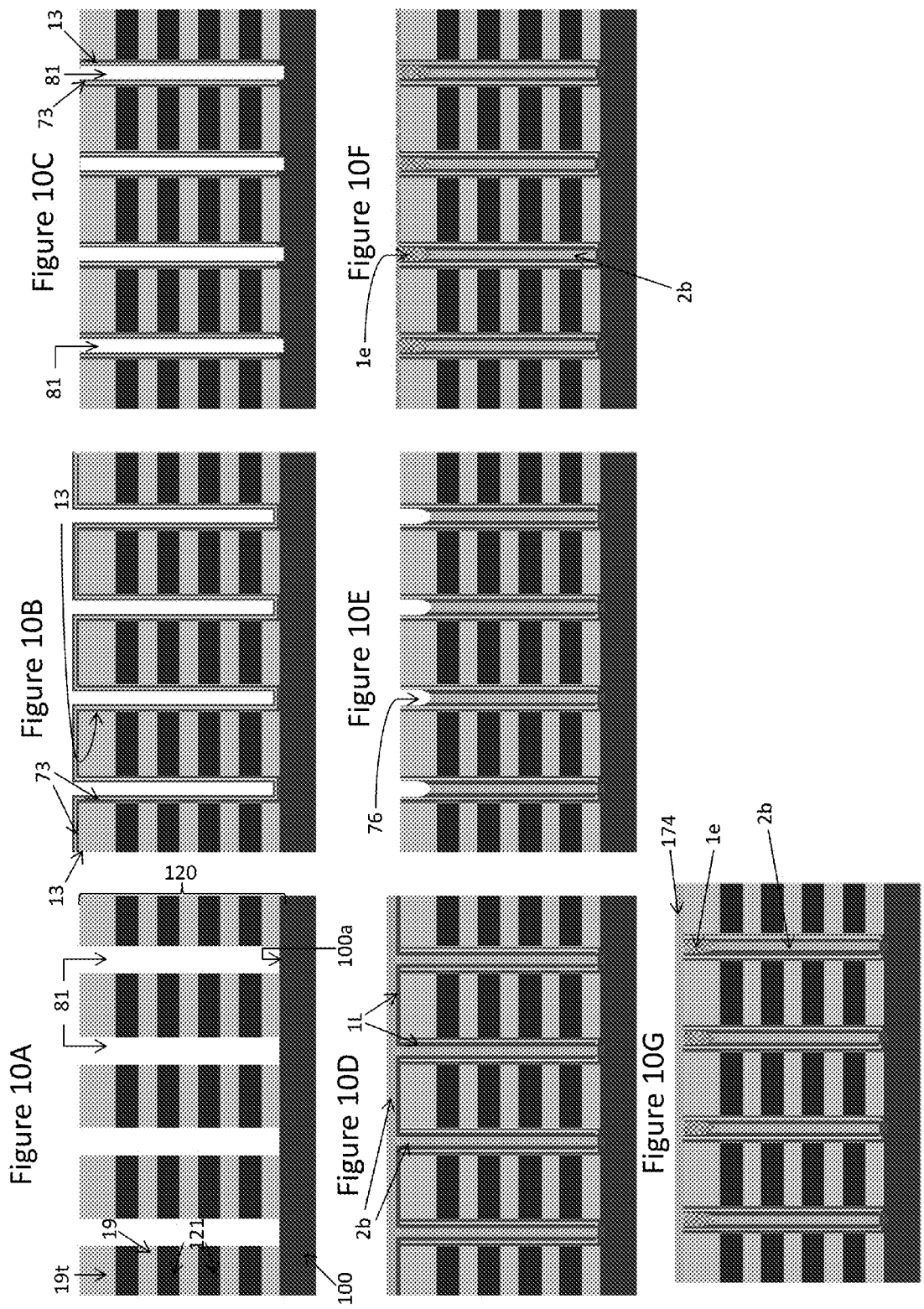

THREE DIMENSIONAL NAND DEVICES WITH AIR GAP OR LOW-K CORE

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a monolithic three dimensional NAND string device which includes a semiconductor channel, at least one end portion of the semiconductor channel extending substantially perpendicular to a major surface of a substrate, a plurality of control gate electrodes extending substantially parallel to the major surface of the substrate in different device levels, a blocking dielectric located in contact with the plurality of control gate electrodes, at least one charge storage region located in contact with the blocking dielectric, and a tunnel dielectric located between the at least one charge storage region and the semiconductor channel. The semiconductor channel is a hollow body surrounding a middle region and at least one of an air gap or a low-k insulating material having a dielectric constant of less than 3.9 is located in the middle region.

Another embodiment relates to a method of making a monolithic three dimensional NAND string, comprising forming a stack of alternating layers of a first material and a second material different from the first material over a substrate, etching the stack to form at least one opening in the stack, forming a blocking dielectric layer in the at least one opening, forming at least one charge storage region in the at least one opening, forming a tunnel dielectric layer in the at least one opening, forming a hollow semiconductor channel layer surrounding a middle region in the at least one opening, and forming at least one of an air gap or a low-k insulating material having a dielectric constant of less than 3.9 located in the middle region.

BRIEF DESCRIPTION OF THE DRAWINGS

FIGS. 1A and 1B are respectively side cross sectional and top cross sectional views of a NAND string according to one embodiment of the invention. FIG. 1A is a side cross sectional view of the device along line Y-Y' in FIG. 1B, while FIG. 1B is a side cross sectional view of the device along line X-X' in FIG. 1A.

FIG. 4B is a side cross sectional view of the device along line B-B' in FIG. 4A, while FIG. 4C is a side cross sectional view of the device along line W-W' in FIG. 4A.

FIG. 5A is a cut-away, three dimensional perspective of the device of FIGS. 4A-4C, but with the optional lower semiconductor pillar omitted. FIG. 5B is a close up, cross sectional view of one memory cell of FIG. 5A.

FIGS. 7A-7I illustrate a method of making NAND strings according to an embodiment.

FIGS. 8A-8G illustrate a method of making NAND strings according to an alternative embodiment.

FIGS. 9A-9E illustrate a method of making NAND strings according to an alternative embodiment.

FIGS. 10A-10G illustrate a method of making NAND strings according to an alternative embodiment.

DETAILED DESCRIPTION

Figure 2:
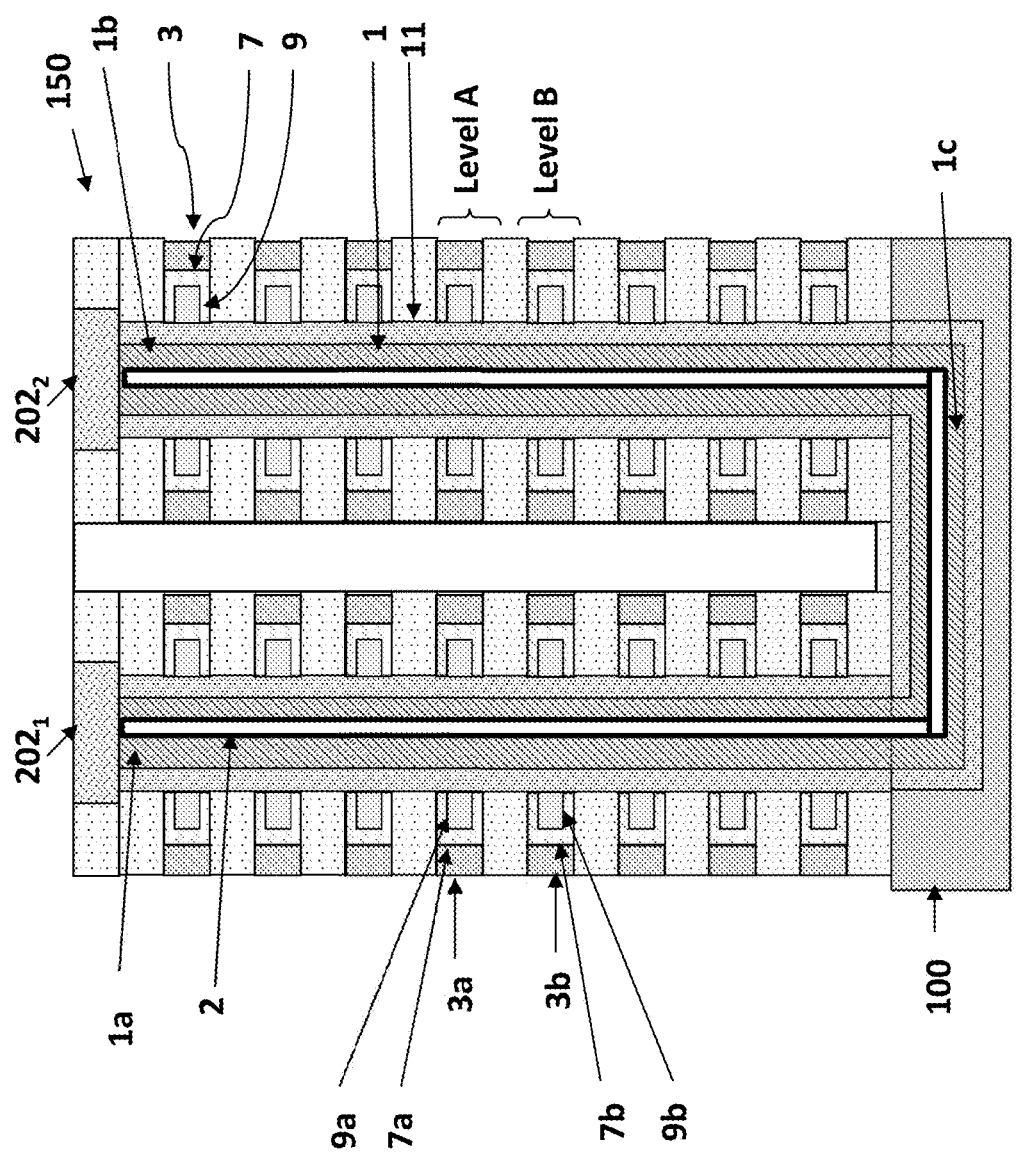
FIG. 2 is a side cross sectional view of a NAND string of another embodiment with a U-shaped channel.

The present inventors have realized that by at least partially replacing the silicon oxide core dielectric with an air gap or low-k insulating layer in a three dimensional NAND string leads to a higher boosting potential and lower program disturb during operation of the device. For example, replacing silicon oxide with an air gap leads to boosting potential increase during the whole length of programming pulse, and this increase can be up to 0.6-0.7V. The low-k insulating layer and air gap also exhibit a lower drain induced barrier lowering ("DIBL") effect and lower leakage in sub-threshold regimes. DIBL is a short channel effect in transistors where increased drain bias leads to increased leakage and lower boosting potential for the NAND string.

As used herein, a low-k insulating layer is a layer having a dielectric constant below 3.9 (i.e., below the typical dielectric constant of undoped silicon dioxide). For example, the low-k insulating material may have a dielectric constant of 1.1 to 3.3, such as 1.9 to 2.9. Any suitable low-k insulating material may be used, such as a doped silicon oxide, organic insulating material, hybrid organic/inorganic insulating material, or porous insulating material.

In a non-limiting embodiment, the doped silicon oxide may be selected from at least one of carbon, fluorine and hydrogen doped oxide, such as fluorinated glass (SiOF) or hydrogen silesquioxane (HSQ). In a non-limiting embodiment, the organic insulating material may be selected from at least one of a polyimide (e.g., fluorinated and non-fluorinated polyimides), aromatic polymer, parylene (e.g., parylene-F or parylene-N), fluorine-doped amorphous carbon, PTFE, poly (arylene ether), diamond-like carbon, or fluorine-doped diamond-like carbon. In a non-limiting embodiment, the hybrid organic/inorganic insulating material may be selected from hydrogen doped silicon carbide, hydrogen doped silicon oxycarbide, silicon carbonitride, or methylsilsesquioxane (MSQ)-based amorphous SiOC:H polymer. In a non-limiting embodiment, the porous insulating material may be an aerogel or a xerogel material, or another porous insulating material, such as porous MSQ, porous silicon dioxide, etc. The porous insulating material may have a dielectric constant below 1.9, such as 1.1 to 1.8, depending on the material composition and degree of porosity. The above low-k materials may be deposited using any suitable deposition method, such as spin-on coating or chemical vapor deposition ("CVD").

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3:
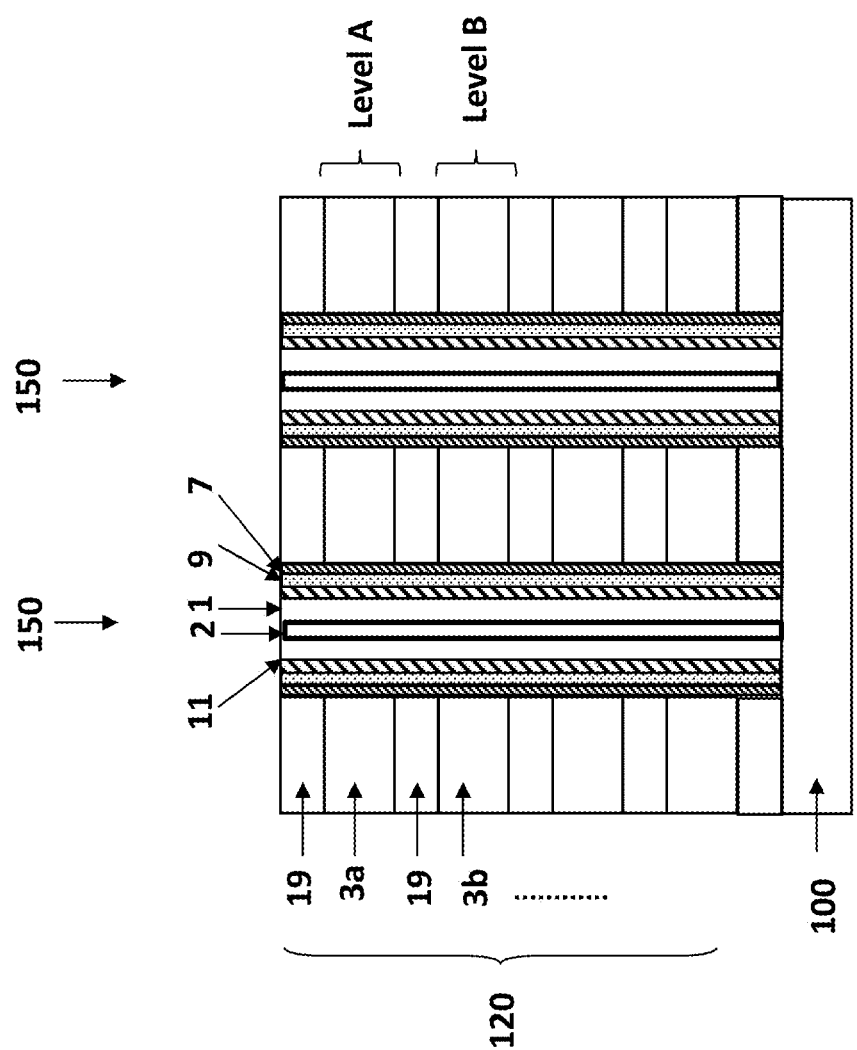
FIG. 3 is a side cross sectional view of another embodiment NAND string.

In some embodiments, the monolithic three dimensional NAND string 150 comprises a semiconductor channel 1 having at least one end portion extending substantially perpendicular to a major surface 100a of a substrate 100, as shown in FIGS. 1A, 2, 3, 4B and 4C. "Substantially perpendicular to" (or "substantially parallel to") means within 0-10°. For example, the semiconductor channel 1 may have a pillar shape and the entire pillar-shaped semiconductor channel extends substantially perpendicularly to the major surface of the substrate 100, as shown in FIGS. 1A and 3. In these embodiments, the source/drain electrodes of the device can include a lower electrode 102 provided below the semiconductor channel 1 and an upper electrode 202 formed over the semiconductor channel 1, as shown in FIG. 1A.

Alternatively, the semiconductor channel 1 may have a U-shaped pipe shape, as shown in FIG. 2. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1-4C for clarity. However, the source side select transistor 50 and drain side select transistor 60 are shown in FIG. 5A. These transistors may have one select gate or plural select gates as shown in FIG. 5A.

The semiconductor channel 1 may be hollow, for example a hollow cylinder, containing a hollow air gap or low-k insulating material 2 having a dielectric constant of less than 3.9 located in the middle region (e.g., core region) 12, as shown in FIG. 5B. In other words, the middle region 12 is the hollow middle part of the channel 1.

Figure 4A:
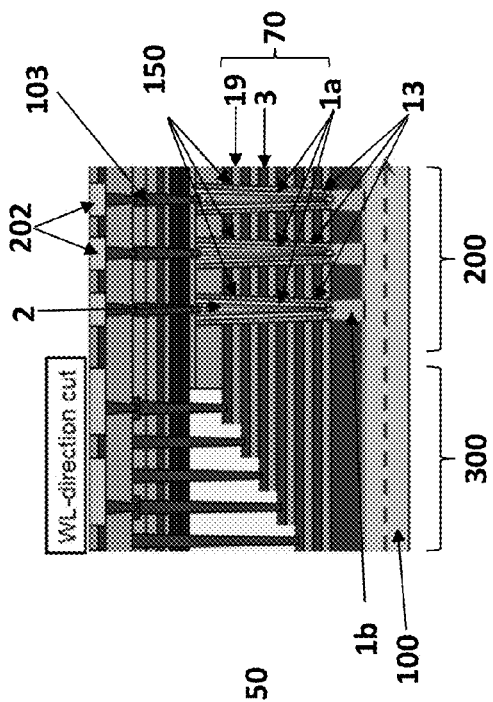
FIG. 4A is a top cross sectional view of a memory block of an embodiment of the invention.
Figure 4C:
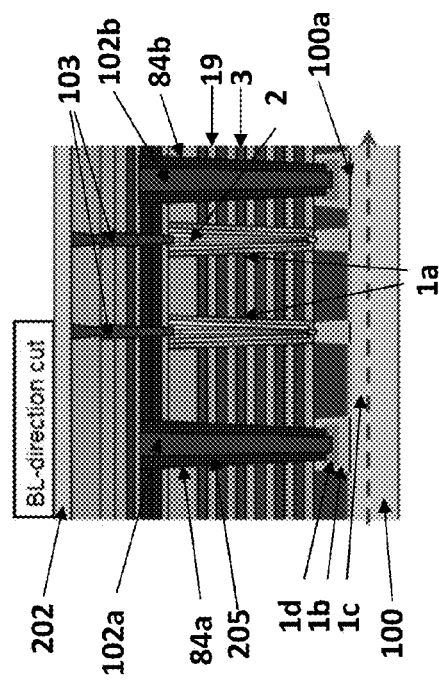
FIGS. 4B and 4C are side cross sectional views of the memory block of FIG. 4A along the bit line and word line directions, respectively.
Figure 4B:
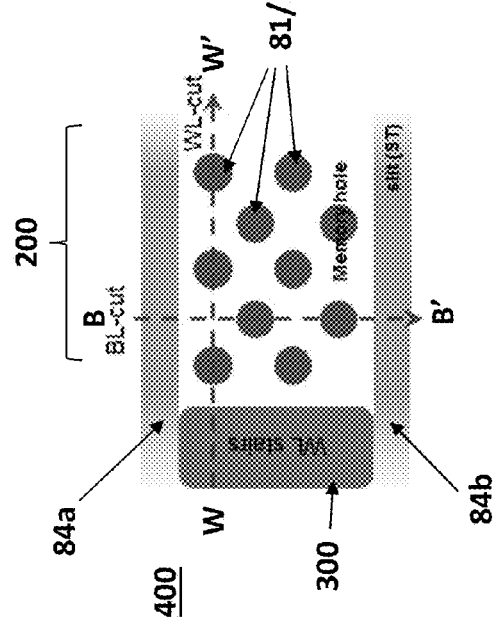

FIGS. 4A to 4C illustrate a memory block 400 containing an array of a plurality of vertical NAND strings 150 according to another embodiment of the invention. Each string includes the memory device levels 70, respectively, as shown in FIG. 4C. FIGS. 4A and 4C show the location of memory region 200 and the stepped word line contact region 300. FIG. 5A shows a three dimensional view of the device of FIGS. 4A-4C (with the silicon pillar 1b under the source 1d and the silicon pillar 1b under channel portion 1a omitted) and FIG. 5B shows a close up of one memory cell 20 of the device of FIG. 5A.

A first source electrode 102a is located in the first dielectric filled trench 84a and a second source electrode 102b is located in the second dielectric filled trench 84b in each block 400, as shown in FIGS. 4A, 4B and 5A. In the memory device levels 70, the dielectric fill in the trench 84 may comprise any suitable insulating layer 205, such as silicon oxide, etc., which is located on both walls of the trench 84. The source electrode 102 is located in the middle of the trench 84 and is separated from the control gate electrodes 3 by the insulating layer 205, as shown in FIGS. 4B and 5A. Drain electrodes (e.g., bit lines) 202 and drain lines 103 are located over the NAND memory cell region in memory device levels 70.

As discussed above, each NAND string 150 contains a NAND memory cell region in the memory device levels 70 which includes the semiconductor channel 1 which contains a portion 1a which extends substantially perpendicular to the major surface 100a of the substrate 100. A bottom portion 1c of the channel 1 is located in or over the major surface 100a of the substrate 100, and extends toward the doped source region 1d substantially parallel to the major surface of the substrate. A drain region 1e is located in the upper part of the channel portion 1a in contact with a respective drain line 103, as shown in FIG. 5A. An optional semiconductor pillar may form an optional vertical portion 1b of the channel which extends substantially perpendicular to the major surface 100a of the substrate 100 and which contacts the source region 1d. The source region 1d may be located in the pillar above portion 1b of the channel or in the major surface 100a of the substrate.

The device contains a plurality of control gate electrodes 3 that extend substantially parallel to the major surface 100a of the substrate 100 in the memory device levels 70 from the memory region 200 to the stepped word line contact region 300. The portions of the control gate electrodes 3 which extend into region 300 may be referred to as "word lines" herein. The drain electrode (e.g., bit line) 202 electrically contacts an upper portion of the semiconductor channel 1 via drain lines 103.

Furthermore, each NAND string 150 contains at least one memory film 13 which is located adjacent to the semiconductor channel 1 (e.g., at least next to portion 1a of the channel) in the memory device levels 70, as shown in FIG. 4C. Specifically, the memory film 13 is located between the semiconductor channel 1 and the plurality of control gate electrodes 3. Each memory cell 20 includes a portion of the channel 1, a control gate electrode 3 and a portion of the memory film 13, as shown in FIGS. 5A and 5B. The memory film 13 contains the tunnel dielectric 11, the charge storage region(s) 9 (e.g., a charge trapping layer or floating gates), and the blocking dielectric 7, as shown in FIG. 5B. Each part of the memory film 13, such as the tunnel dielectric 11, the charge storage region 9, and/or the blocking layer 7 may be comprised of one or more layers (e.g., one or more dielectric layers) made of different materials. The middle region 12 is located in the middle of the channel 1 portion 1a.

As shown in FIG. 4C, the control gate electrodes 3 extend in the word line direction W-W' which is perpendicular to the bit line direction B-B'. The control gate electrodes 3 are continuous in the array in the memory block 400. In other words, the control gate electrodes 3 have a shape of a continuous strip or sheet with discrete openings 81 (which are referred to herein as front side openings or memory openings) which contain the NAND strings 150. However, the control gate electrodes 3 have electrical and physical continuity in the bit line direction between the trenches 84 and in the word line direction throughout the block 400. In other words, the memory openings 81 do not completely sever the continuous electrical and physical path in the control gate electrodes from one trench 84 to the opposite trench 84 in each block.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A to 4C. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof. For example, the control gate material in FIGS. 1A, 2, 4B and 4C may comprise a conductive metal or metal alloy, such as tungsten and/or titanium nitride, while the control gate material in FIG. 3 may comprise doped polysilicon.

A blocking dielectric 7 is located adjacent to the control gate(s) 3 and may surround the control gate electrodes 3, as shown in FIGS. 1A and 2. Alternatively, a straight blocking dielectric layer 7 may be located only adjacent to an edge (i e, minor surface) of each control gate electrode 3, as shown in FIG. 3. The blocking dielectric 7 may comprise a layer having plurality of blocking dielectric segments located in contact with a respective one of the plurality of control gate electrodes 3, for example a first blocking dielectric segment 7a located in device level A and a second blocking dielectric segment 7b located in device level B are in contact with control electrodes 3a and 3b, respectively, as shown in FIG. 2. Alternatively, the blocking dielectric 7 may be a straight, continuous layer, as shown in FIG. 3, similar to the device described in U.S. Pat. No. 8,349,681 issued on Jan. 8, 2013 and incorporated herein by reference in its entirety.

The monolithic three dimensional NAND string also comprise a charge storage region 9. The charge storage region 9 may comprise one or more continuous layers which extend the entire length of the memory cell portion of the NAND string, as shown in FIG. 3. For example, the charge storage region 9 may comprise an insulating charge trapping material, such as a silicon nitride layer.

Alternatively, the charge storage region may comprise a plurality of discrete charge storage regions 9, as shown in FIGS. 1A and 2. The plurality of discrete charge storage regions 9 comprise at least a first discrete charge storage region 9a located in the device level A and a second discrete charge storage region 9b located in the device level B, as shown in FIG. 2. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers) or high-k materials such as aluminum oxide, hafnium oxide or combinations thereof.

The blocking dielectric 7, charge storage region(s) 9 and the tunnel dielectric 11 together is also referred to herein as a memory film 13, as shown in FIGS. 4B, 4C and 5B.

If desired, an optional barrier layer 4 may be located between the control gate electrode 3 and the blocking dielectric 7, as shown in FIG. 5B. The barrier layer 4 may comprise any suitable conductive barrier material, such as titanium nitride or tungsten nitride for tungsten control gate electrodes 3.

In summary, as shown in FIGS. 1B, 4A, 5A and 5B, the middle region 12 comprises a cylinder shaped region having an axis extending substantially perpendicular to the major surface 100a of the substrate 100. At least the portion 1a of the semiconductor channel 1 comprises a hollow cylinder shaped channel surrounding the middle region 12. The tunnel dielectric 11 comprises a cylinder which surrounds the semiconductor channel 1 (e.g., at least portion 1a of channel 1). As described above, the tunnel dielectric 11 may comprise a single insulating layer or a stack of a plurality of insulating layers comprised of different materials. The at least one charge storage region 9 comprises a cylinder shaped plurality of vertically spaced apart floating gates or a cylinder shaped dielectric charge storage layer which surrounds the tunnel dielectric 11. The blocking dielectric 7 comprises a cylinder which surrounds the at least one charge storage region 9. As described above, the blocking dielectric may comprise a single insulating layer or a stack of a plurality of insulating layers comprised of different materials. The control gate electrodes 3 surround the blocking dielectric 7.

In one embodiment shown in FIGS. 1A-5B the air gap or the low-k insulating layer 2 fills the entire middle region 12 inside the hollow channel 1 (e.g., inside the hollow channel portion 1a). In other words, the air gap or the low-k insulating layer 2 contacts the inner surface of the hollow channel 1 and there is no other material located inside the air gap or the low-k insulating layer 2 in the middle region 12.

However, in alternative embodiments described below the air gap or the low-k insulating layer 2 each fills only a part of middle region inside the hollow channel 1.

Figure 6B:
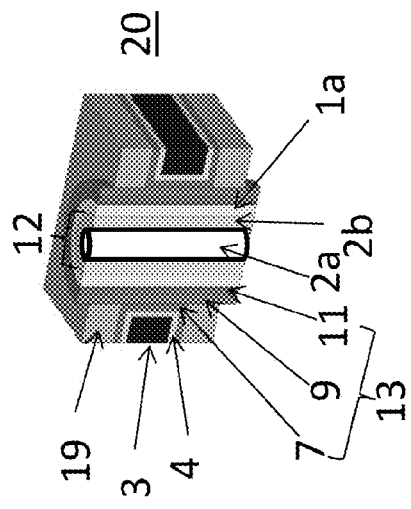
FIGS. 6A, 6B and 6C are close up, cross sectional view of memory cells of alternative embodiments containing plural portions in the middle region in the channel.
Figure 6C:
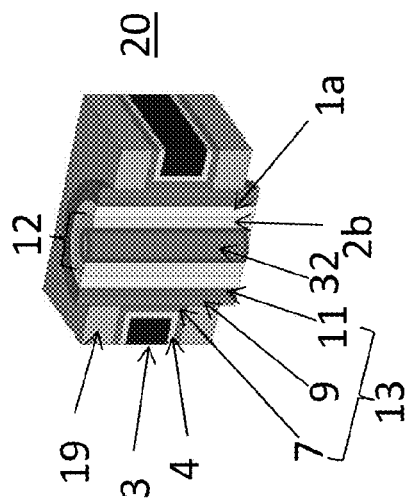
Figure 6A:
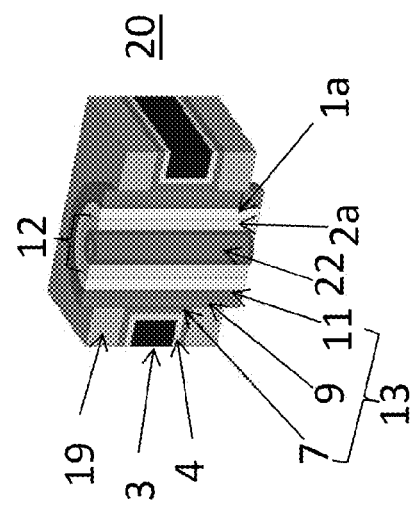

In a first alternative embodiment illustrated in FIG. 6A, an insulating material 22 is located in a core (i.e., center) of the middle region 12 and the air gap 2a surrounds the insulating material 22. In this embodiment, the insulating material 22 may comprise the above described low-k insulating material (e.g., having a dielectric constant of less than 3.9), silicon oxide (e.g., having a dielectric constant of about 3.9), or a high-k insulating material (e.g., having a dielectric constant of more than 3.9), such as silicon nitride or a metal oxide (e.g., aluminum oxide, hafnium oxide, tantalum oxide, etc.).

In a second alternative embodiment illustrated in FIG. 6B, the middle region 12 contains both the air gap and the low-k insulating material. In this embodiment, the air gap 2a is located in a core (i.e., center) of the middle region 12, and the low-k insulating material 2b surrounds the air gap 2a in the middle region 12.

In a third alternative embodiment illustrated in FIG. 6C, mid-k or high-k insulating layer 32 (e.g., the above described silicon oxide having a dielectric constant of about 3.9 or high-k insulating material having a dielectric constant of 3.9 or higher) is located in a core (i.e., center) of the middle region 12, and the above described low-k insulating material 2b surrounds the silicon oxide or high-k insulating material 32 in the middle region 12.

In the embodiments containing the air gap 2a in the middle region 12, an air bridge layer is preferably located over the air gap, as will be described with respect to various embodiments below which describe a method of making the devices described above. In one embodiment, an insulating air bridge 79, 89 is located over the air gap 2a in the middle region 12 and a doped semiconductor drain region 1e is located in electrical contact with an upper portion of the semiconductor channel layer 1, 1a over the insulating air bridge. In another embodiment, a semiconductor drain air bridge 99 is located over the air gap 2a in the middle region 12.

A first embodiment of making monolithic three dimensional NAND strings 150 with an air gap 2a is illustrated in FIGS. 7A-7I. As illustrated in FIG. 7A, a stack 120 of alternating first material layers 19 and second material layers 121 is provided over a major surface 100a of a substrate 100. The first material layers 19 comprise an insulating material and the second material layers 121 comprise sacrificial layers. In an embodiment, the first material layers 19 comprise silicon oxide and the second material layers 121 comprise polysilicon, amorphous silicon, or silicon nitride. Alternatively, the second material layers 121 may comprise doped semiconductor or electrically conductive control gate layers, similar to the embodiment shown in FIG. 3.

If desired, a top insulating layer 19t may have a greater thickness and/or a different composition from the other insulating layers 19. For example, the top insulating layer 19t may comprise a cover silicon oxide layer made using a TEOS source while the remaining layers 19 may comprise thinner silicon oxide layers may using a different source. The method includes forming front side openings 81 by RIE or another suitable etching method. The stack 120 includes a plurality of front side openings 81 (e.g. a plurality of cylindrical memory holes shown in FIG. 1B).

As shown in FIG. 7B, the next step includes forming at least a portion of the memory film 13 in the front side openings 81. For example, the tunnel dielectric 11 is formed in the front side opening 81. If desired, the blocking dielectric 7 and/or the charge storage region(s) 9 portions of the memory film may also be formed in the front side openings 81 prior to forming the tunnel dielectric 11, such that the entire memory film 13 is formed in the front side openings 81, as shown in FIG. 7B. Thus, in this embodiment, the method include forming the blocking dielectric layer 7 in the front side openings 81, forming the at least one charge storage region 9 over the blocking dielectric layer 7 in the front side openings, and forming the tunnel dielectric layer 11 over the at least one charge storage region 9 in the front side openings.

Alternatively, the blocking dielectric 7 and/or the charge storage region(s) 9 may be formed from the back side through the back side opening 84 and back side recesses as shown in FIGS. 4B-6C and as will be described in more detail below with respect to FIGS. 12-19.

If desired, an optional cover layer 73, such as an amorphous silicon layer, is formed over the tunnel dielectric portion of the memory film 13, as shown in FIG. 7B. The cover layer 73 and the memory film 13 are then anisotropically etched to remove the cover layer 73 and the memory film 13 from the bottom portions 81a of the front side openings 81 while leaving layer 73 and film 13 on the sidewalls of the front side openings 81, as shown in FIG. 7C. This etching step exposes the upper surface of the substrate 100 in the bottom portions 81a of the front side openings 81. Layer 73 protects the tunnel dielectric portion of the memory film 13 during the etching step. If desired, layer 73 may be removed after the etching step. Alternatively, if layer 73 comprises a semiconductor material, such as silicon, then it may be retained in the device to become part of the channel.

Next, FIGS. 7D through 7F illustrate the next steps in the method, including forming the hollow semiconductor channel layer 1 by forming the semiconductor channel layer over the tunnel dielectric layer in the front side openings and forming the at least one of the air gap or the low-k insulating material 2 in the middle region 12 in the front side openings 81.

First the semiconductor channel layer 1L is formed over the cover layer 73, as shown in FIG. 7D. Layer 1L may comprise an amorphous silicon layer or a polysilicon layer. Layer 1L contacts the exposed semiconductor substrate 100 in the bottom portions 81a of the front side openings 81. Layers 1L and 73 together form the portion 1a of the semiconductor channel 1.

As shown in FIG. 7D, a sacrificial material 75 is formed over the semiconductor channel layer 1L in the front side openings such that the sacrificial material exposes an upper portion of the semiconductor channel layer 1L. The sacrificial material 75 may comprise an organic material, such as photoresist or amorphous carbon.

The sacrificial material 75 may be recessed by etch back after deposition to form a recess 76 in the upper portions of the front side openings 81 to expose the channel layer 1L, as shown in FIG. 7E. Alternatively, the sacrificial material 75 may be deposited to partially fill the front side openings 81 to leave the recesses 76 in the upper portions of the front side openings 81 to expose the channel layer 1L.

Then, as further shown in FIG. 7E, a hollow first insulating layer 77 is formed over the sacrificial material 75 in the recesses 76. The hollow first insulating layer 77 narrows a width of the front side opening 81 in the recess 76 and exposes an upper portion of the sacrificial material 75 below and an upper portion of the semiconductor channel layer 1L in the recess 76 above. Layer 77 may comprise a non-conformal, low temperature $SiO_2$ layer (e.g., deposited at below 120° C. by CVD) such that it is deposited to partially fill the recess 76 (e.g., as a hollow ring on the sidewalls of the recess 76) over the sacrificial material 75.

The sacrificial material 75 is then selectively removed through the opening in layer 77 to leave the hollow first insulating layer 77 suspended in the front side openings 81, as shown in FIG. 7F. If the sacrificial material is photoresist, then it may be removed through the opening in layer 77 either by exposure to radiation to uncross-link the photoresist followed by ashing, or by etching using a $H_2SO_4+H_2O_2$ chemistry. Other suitable methods may be used for other sacrificial materials (e.g., ashing for amorphous carbon or selective etching for other materials).

Then, as further shown in FIG. 7F, a second insulating air bridge layer 78 is formed over the hollow first insulating layer 77 to leave the air gap 2a in the middle region of the front side openings 81 below the second insulating air bridge layer 78. Layer 78 may comprise a silicon oxide layer deposited by selective CVD such that the bottom of the recess in layer 77 which has a smaller critical diameter is clogged with layer 78.

The second insulating air bridge layer 78 may be recessed by etching to expose the upper portion of the semiconductor channel layer 1L, as shown in FIG. 7F to form the air bridge 79. Alternatively, the insulating air bridge layer 79 is deposited only over the hollow first insulating layer 77 without covering the upper portion of the semiconductor channel layer 1L to form the air bridge 79.

Then, as shown in FIGS. 7G-7H a doped semiconductor drain region 1e is formed in electrical contact with the upper portion of the semiconductor channel layer 1L over the second insulating air bridge layer 78. The drain region 1e may be formed by depositing a semiconductor cap layer 80 (e.g., amorphous silicon or polysilicon cap layer) and implanting dopants (e.g., N-type dopants, such as arsenic or phosphorus) into the layer, as shown in FIG. 7G. Layer 80 is then planarized by etched back or CMP even with the top insulating layer 19t to leave the drain regions 1e in contact with the upper part of the channel layer 1L, as shown in FIG. 7H. This stage of the process is then completed by forming a cover layer 174, such as a silicon oxide cover layer using a TEOS source, over the entire device, as shown in FIG. 7I.

The process described above forms the air gap 2a in the middle region. Preferably, the insulating layers 77, 78 are not deposited into the middle region. However, it is possible that there may be some layer 77 and/or 78 residue on the inner sidewalls of the channel 1a in the middle region, as shown in FIGS. 7F-7I.

In another embodiment illustrated in FIGS. 8A-8G, the insulating air bridge is formed by a single non-conformal insulating layer deposition. The steps shown in FIGS. 8A-8C to form at least a portion of the memory film 13 and the channel layer 1L in the front side openings 81 are the same as those shown in FIGS. 7A-7C and will not be described further.

Then, as shown in FIG. 7D, a non-conformal insulating air bridge layer 88 is formed in the upper portion of the front side openings 81 to form the air gap 2a located below the non-conformal insulating air bridge layer 88. Layer 88 may be a silicon oxide layer deposited by PECVD using a silane source. The top portions of the openings 81 are closed with the oxide layer 88. Optionally, a small amount of the oxide layer 88 is deposited on the entire sidewalls of the openings 81, while remaining area of the openings 81 forms the air gap 2a. If the opening 81 critical diameter is sufficiently small, then the oxide layer 88 is not deposited on the sidewalls of the middle region in the openings 81 and only the air gap 2a is located in the middle region.

Layer 88 may be recessed to expose an upper portion of the semiconductor channel layer 1L and to form the air bridge 89, as shown in FIG. 8E. A doped semiconductor drain region 1e in electrical contact with the upper portion of the semiconductor channel layer 1L may then be formed over the non-conformal insulating air bridge layer 88, as shown in FIG. 8F, similar to the steps shown in FIGS. 7G and 7H. Finally the cover layer 174 is formed over the device, as shown in FIG. 8G.

FIGS. 9A-9E illustrate a third alternative method in which the semiconductor drain region itself forms the air bridge 99. The insulating air bridge 79, 89 of the prior embodiments is omitted in this embodiment.

The steps shown in FIGS. 9A-9C to form at least a portion of the memory film 13 and the channel layer 1L in the front side openings 81 are the same as those shown in FIGS. 7A-7C and will not be described further.

Then, as shown in FIG. 9D, the semiconductor drain 1e air bridge 99 is formed in the upper part of the front side opening 81 using the method of the first embodiment of FIGS. 7D-7F or the second embodiment of FIGS. 8D-8E. The cover layer 174 is then formed over the device, as shown in FIG. 9E.

The first embodiment method includes forming the sacrificial material 75 over the semiconductor channel layer 1L in the openings 81 such that the sacrificial material exposes an upper portion of the semiconductor channel layer 1L, forming a hollow first layer (e.g., a silicon or an insulating layer 77) over the sacrificial material such that the hollow first layer narrows a width of the openings 81 and exposes an upper portion of the sacrificial material below and an upper portion of the semiconductor channel layer above. The method also includes selectively removing the sacrificial material to leave the hollow first layer suspended in the openings 81, and forming a semiconductor drain 1e air bridge layer 80 in electrical contact with the upper portion of the semiconductor channel layer and over the hollow first layer to leave the air gap in the middle region of the openings 81 below the semiconductor drain air bridge layer.

The second embodiment method includes forming a non-conformal semiconductor drain 1e air bridge layer 80 in electrical contact with an upper portion of the semiconductor channel layer 1e in the openings 81 to leave the air gap 2a located below the semiconductor drain air bridge layer in the openings.

To form the structure shown in FIG. 6A using any of the three methods described above, the following steps are added. First, a hollow sacrificial material is formed over the semiconductor channel layer 1L in the openings 81. Then, the insulating material layer 22 is formed in a hollow core (i.e., center) portion of the hollow sacrificial material. Finally, the hollow sacrificial material is removed to leave the air gap 2a between the semiconductor channel layer 1L and the insulating material layer 22 such that the air gap surrounds the insulating material layer 22. The method then proceeds as described above to form the air bridge 79, 89 or 99.

To form the structure shown in FIG. 6B using any of the three methods described above, the following step is added. The low-k insulating material layer 2b is formed over the semiconductor channel layer 1L in the openings 81 such that the low-k insulating material layer 2b forms a hollow cylinder having the air gap 2a remaining in a core (i.e., center) of the middle region. The method then proceeds as described above to form the air bridge 79, 89 or 99.

FIGS. 10A-10E illustrate a fourth alternative method in which the low-k insulating material 2b is located in the middle region of the openings 81. In the embodiment shown in these Figures, the low-k insulating material 2b fills the entire middle region of the opening 81.

The steps shown in FIGS. 10A-10C to form at least a portion of the memory film 13 and the channel layer 1L in the front side openings 81 are the same as those shown in FIGS. 7A-7C and will not be described further.

Then, as shown in FIG. 10D, the low-k insulating layer 2b is formed over the upper portion of the stack 120 and in the front side openings 81. Layer 2b is then recessed by etch back to leave recesses 76 in the upper portions of the openings 81 over layer 2b, as shown in FIG. 10E. The drain region 1e and the cover layer 174 are then formed as described above, and as shown in FIGS. 10F and 10G.

In another embodiment, to form the structure shown in FIG. 6C, the low-k insulating layer 2b is formed on the sidewalls of the openings 81, to leave a hollow space in the core (i.e., center) of the openings 81. Then, the insulating material 32, such as a silicon oxide or a high-k insulating material having a dielectric constant of 3.9 or higher is formed over the low-k insulating material in the openings 81, such that the silicon oxide or high-k insulating material 32 is located in the core of the middle region of the openings 81, and the low-k insulating material 2b surrounds the silicon oxide high-k insulating material 32 in the middle region, as shown in FIG. 6C.

Figure 11A:
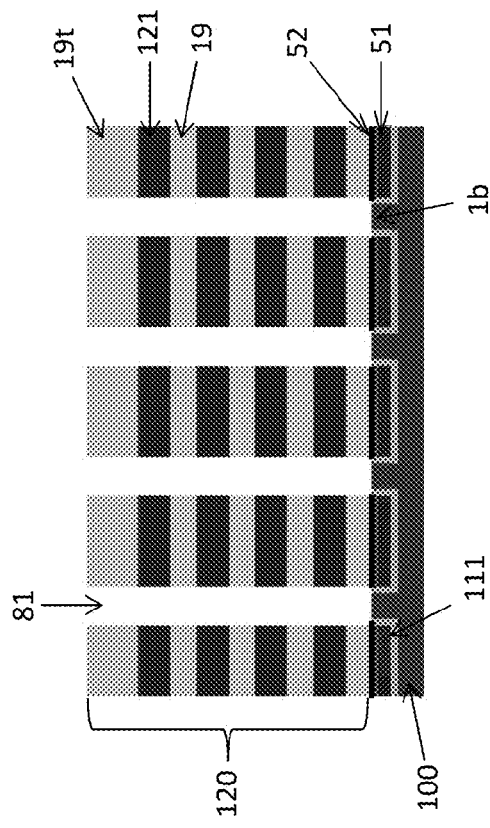
FIGS. 11A and 11B illustrate a method of making NAND strings according to an alternative embodiment.

In another embodiment, any of the methods described above may be used in a device that contains the silicon pillars 1b below the channel layers, as shown in FIGS. 4B and 4C. To form the structure with pillar type source side select gate transistors 50 shown in FIGS. 4B and 4C using any of the methods described above, the following steps are added. First, as shown in FIG. 11A, single crystal silicon pillars 1b are formed over a single crystal silicon surface 100a of the substrate 100. Then, gate insulating layers 111 and select gate electrodes 51 of the source side select transistors 50 are formed between the pillars 1b, as shown in FIG. 11A.

The pillars 1b may be formed by etching pillars into a single crystal silicon substrate 100 or by selectively growing the single crystal silicon pillars on exposed parts of the substrate 100 through a mask. Then, the gate insulating layer 111 and select gate electrodes 51 (e.g., polysilicon or WN/W gate stack or their combination) and an optional silicon nitride cap layer 52 are deposited between the pillars 1b followed by a planarization (e.g., CMP process). The stack 120 described above with respect to FIG. 7A is then formed over the planarized structure, as the process proceeds as described in any of the methods above.

Figure 11B:
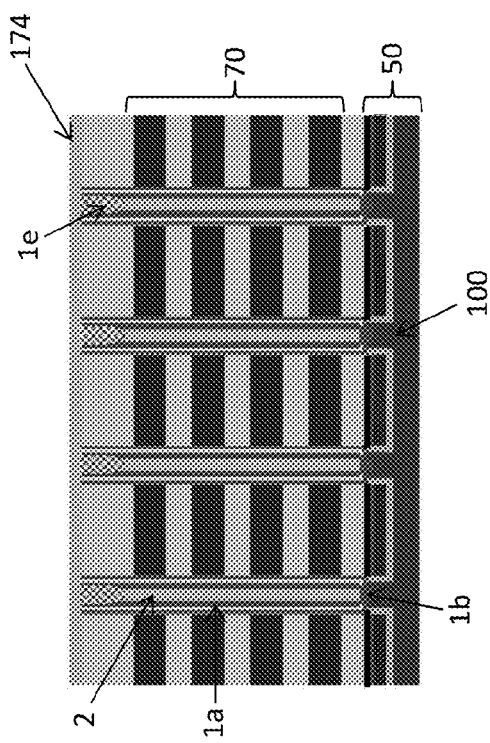

In any of the methods described above, the semiconductor channel layer 1L may comprise an amorphous silicon or polysilicon layer in contact with the respective epitaxial silicon pillar 1b. In this case, the epitaxial silicon pillar 1b comprises a lower portion of a semiconductor channel 1 of the NAND string and the amorphous silicon or polysilicon layer comprises an upper portion 1a of the semiconductor channel 1 of the NAND string, as shown in FIG. 11B. A crystallization anneal may follow the formation of the polysilicon or amorphous silicon channel.

In any of the methods described above, the control gate electrodes 3, and optionally the blocking dielectric 7 and/or the charge storage region(s) 9 may be formed by a replacement process through a back side opening 84, as shown in FIGS. 12-19.

Figure 12:
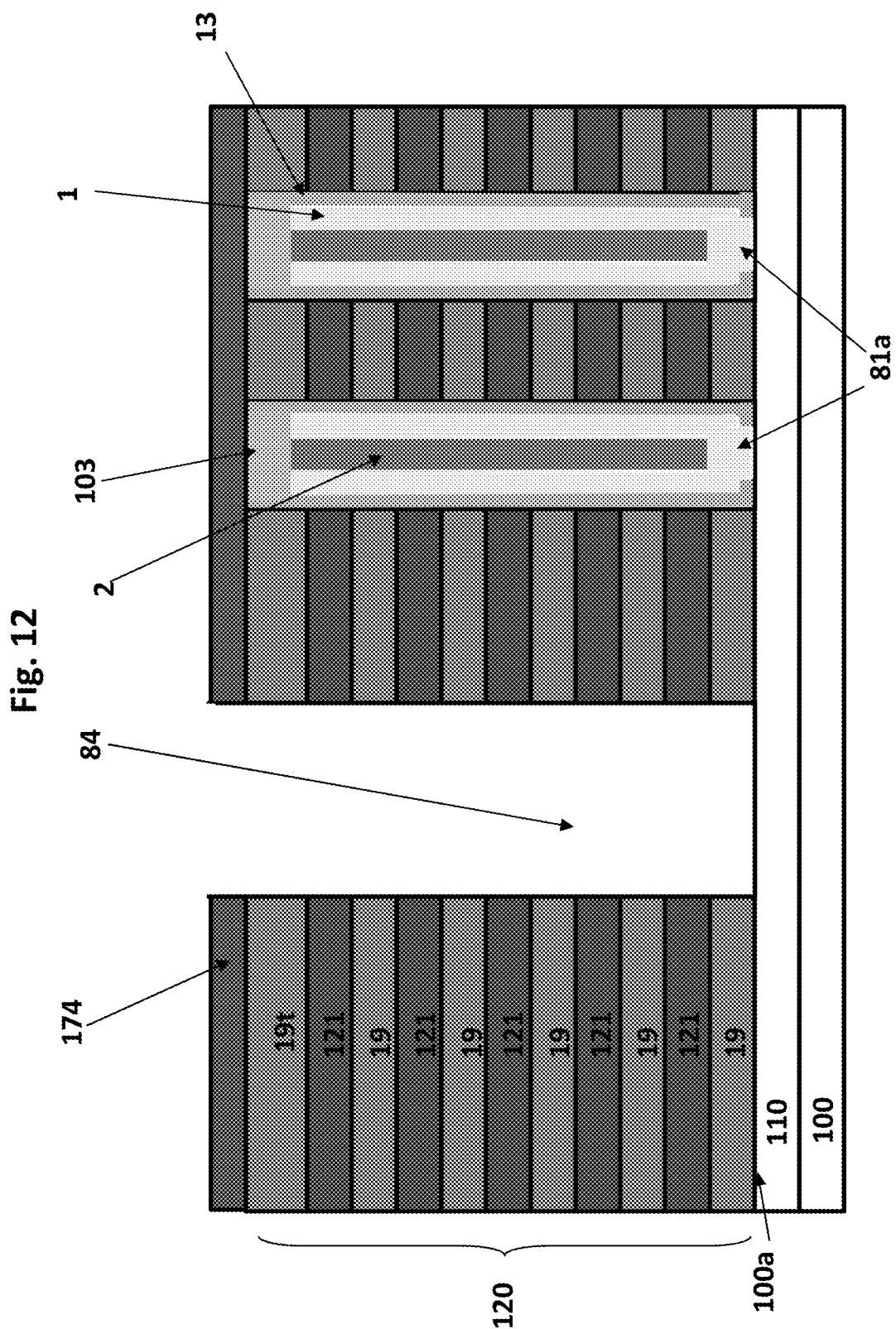
FIGS. 12 to 19 illustrate a method of forming metal replacement gates in the NAND strings of the previous embodiments.

FIG. 12 illustrates the device following the filling of the front side openings 81 and formation of the cover layer 174 according to any of the embodiments above. As shown in FIG. 12, the back side opening 84 (e.g., the slit trench shown in FIGS. 4A, 4B and 5) is then formed in the stack 120 by any suitable lithography and etching steps to expose a p-type doped well (p-well) 110 in the substrate 100.

Figure 13:
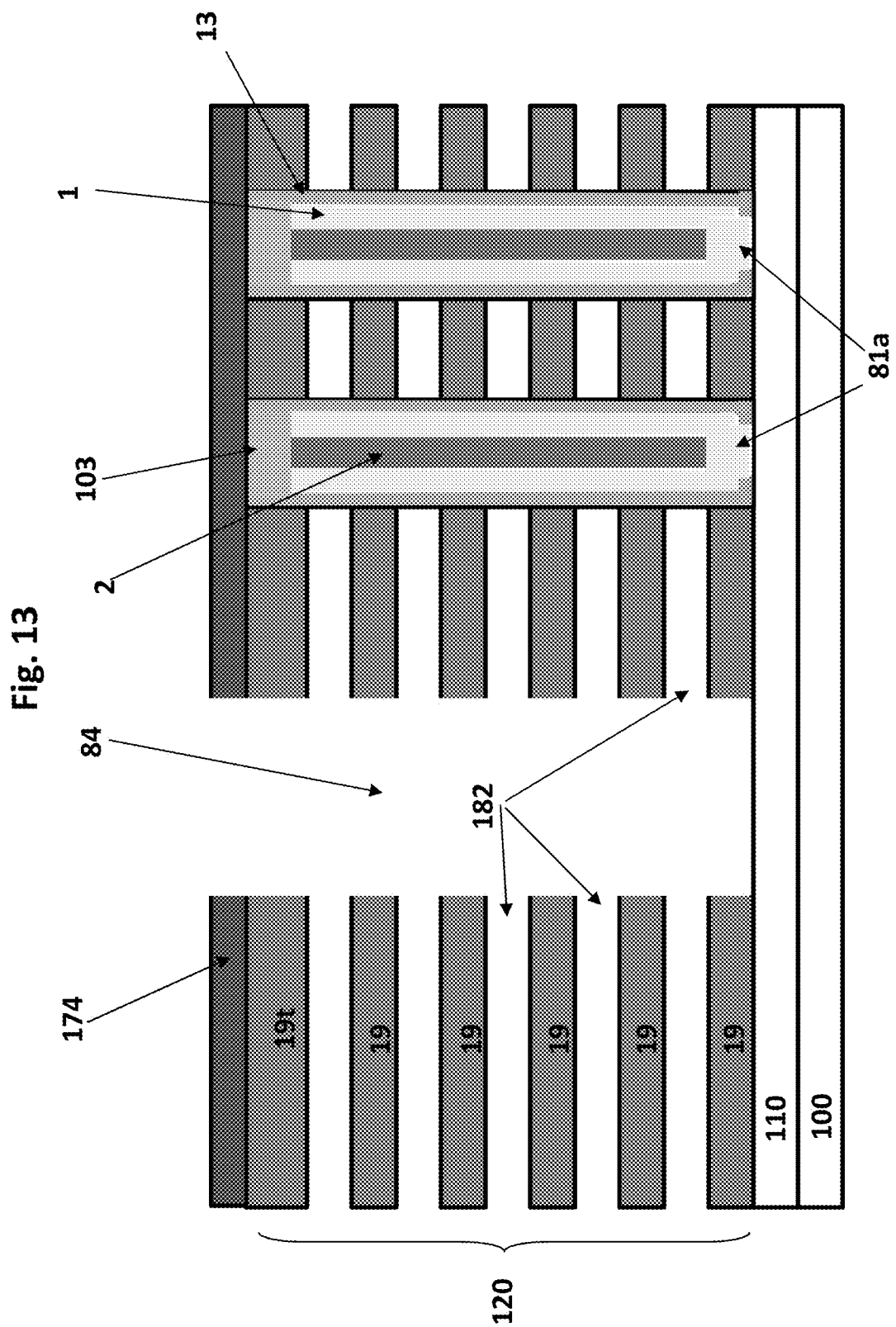

Then, at least a portion of the sacrificial second material layers 121 are removed through the back side openings 84 to form back side recesses 182 between the first material layers 19, as shown in FIG. 13. Layers 121 may be removed by selective etching, such as a silicon nitride selective etching which removes silicon nitride layers 121 but does not remove the silicon oxide layers 174, 19 or the silicon regions. The selective etch may stop on the oxide blocking dielectric, such as a silicon oxide blocking dielectric 7 which forms the outer part of the memory film 13.

Alternatively, the blocking dielectric 7 may be formed from the back side in the back side recesses prior to the control gate electrodes 3. In this embodiment, forming the blocking dielectric layer comprises forming the blocking dielectric layer in the back side opening and in the back side recesses.

If desired, the at least one charge storage region 9 may be formed through either the front side opening or the back side opening. Thus, the step of forming the at least one charge storage region comprises at least one of forming the at least one charge storage region prior to forming the blocking dielectric in the back side opening or forming the at least one charge storage region over the blocking dielectric in the front side opening or over the sidewall in the front side opening (if the blocking dielectric is formed through the back side opening).

Figure 14:
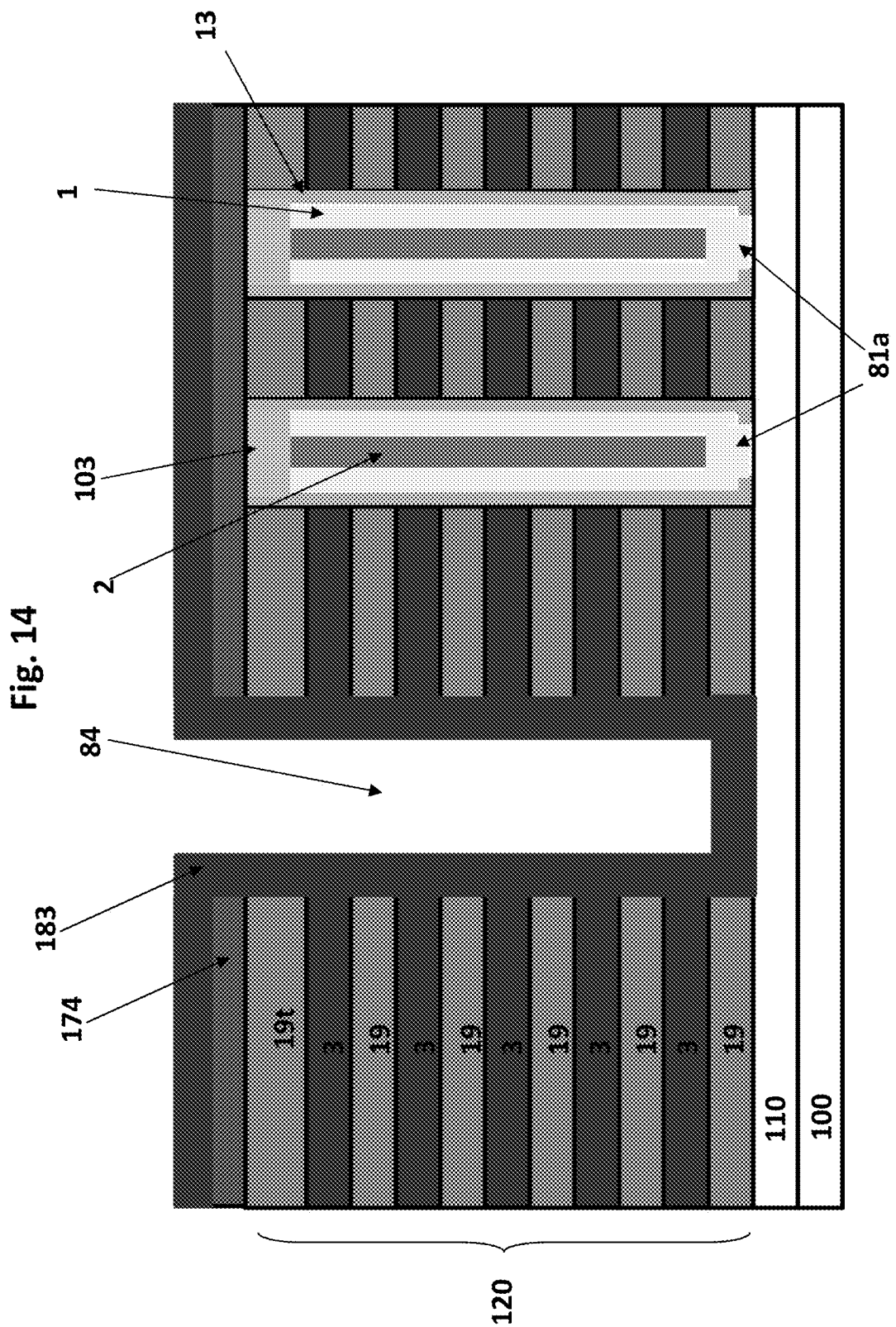

Metal or metal alloy control gate electrodes 3 are then formed in the back side recesses 182 through the back side openings 84, as shown in FIG. 14. A portion 183 of the metal or metal alloy control gate material partially or fully fills the back side openings (e.g., trenches) 84 and is located over layer 174. The control gate electrode 3 material may comprise any suitable materials described above. For example, the material may comprise a TiN liner or barrier layer described above and tungsten gate material 3. If the blocking dielectric layer 7 is formed the back side recesses through the back side opening, then the control gate electrodes 3 are formed over the blocking dielectric layer 7 in the back side recesses.

Figure 15:
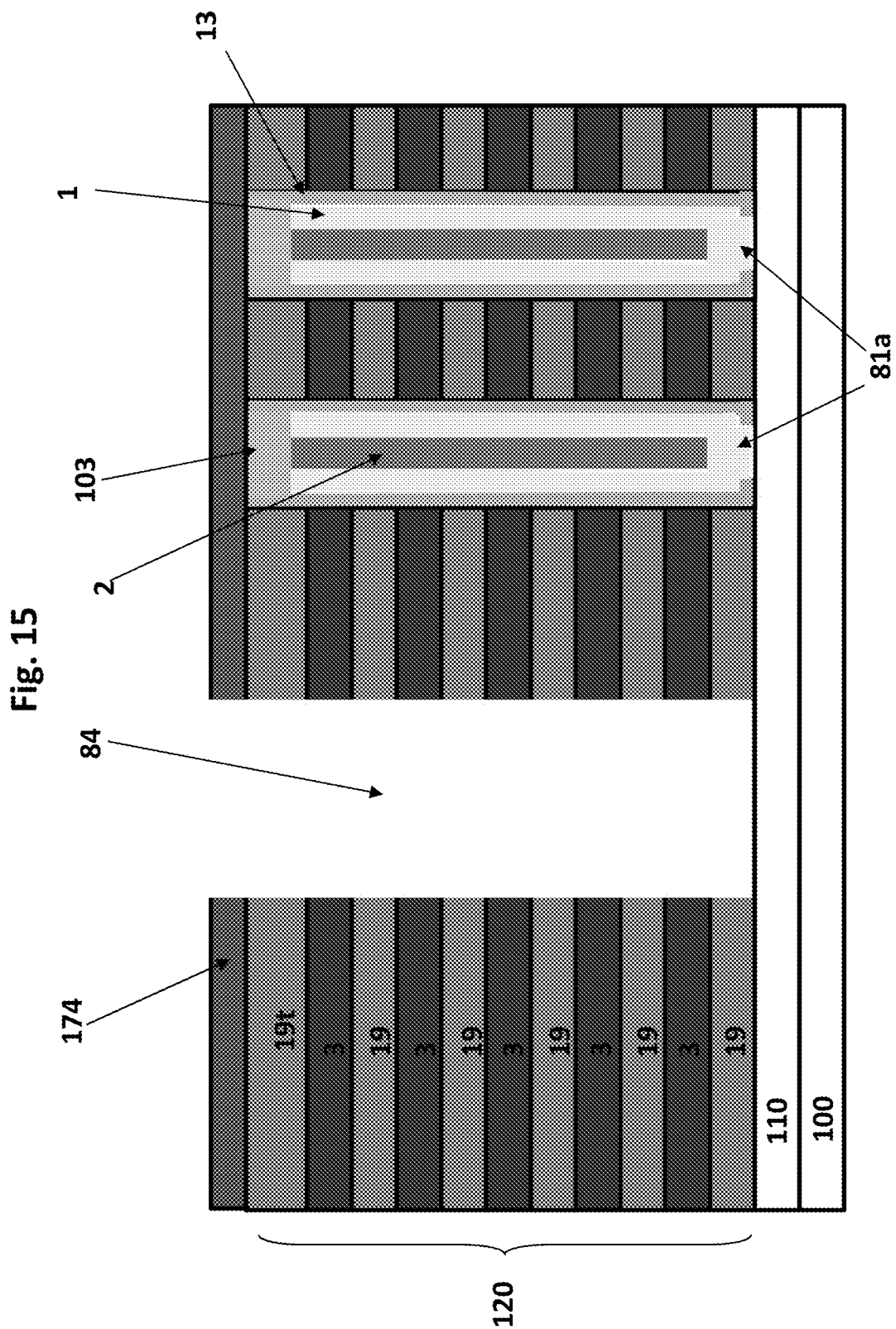

Then, as shown in FIG. 15, the portion 183 of the metal or metal alloy control gate material is removed by anisotropic etching from the back side openings (e.g., trenches) 84 and from over layer 174 without removing the control gate electrodes 3 to complete the formation of the control gate electrodes 3. The select gate electrodes (51 not shown in FIG. 15 for clarity) may be formed above and below the control gate electrodes 3 at the same time or during a different step.

Figure 16:
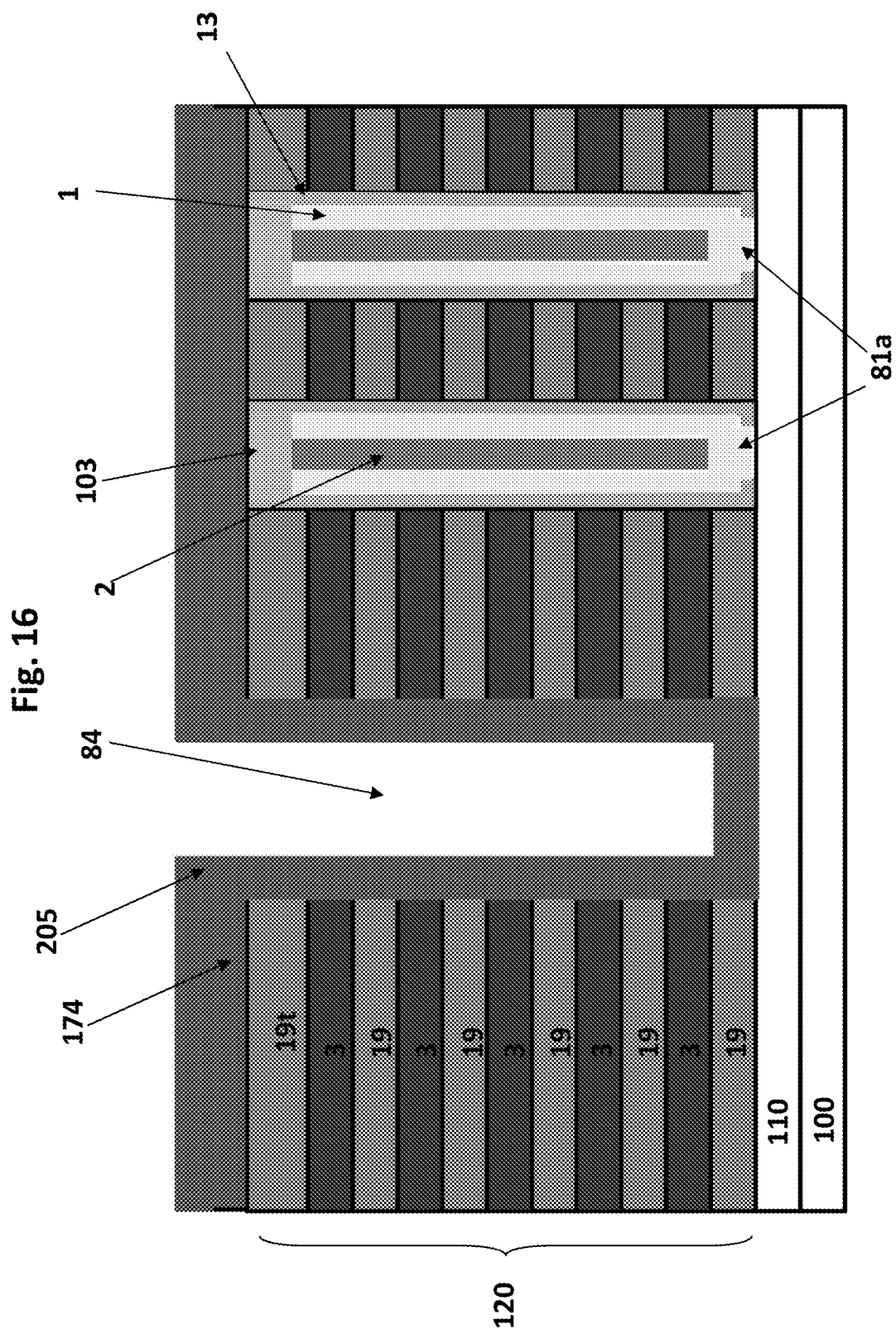
Figure 17:
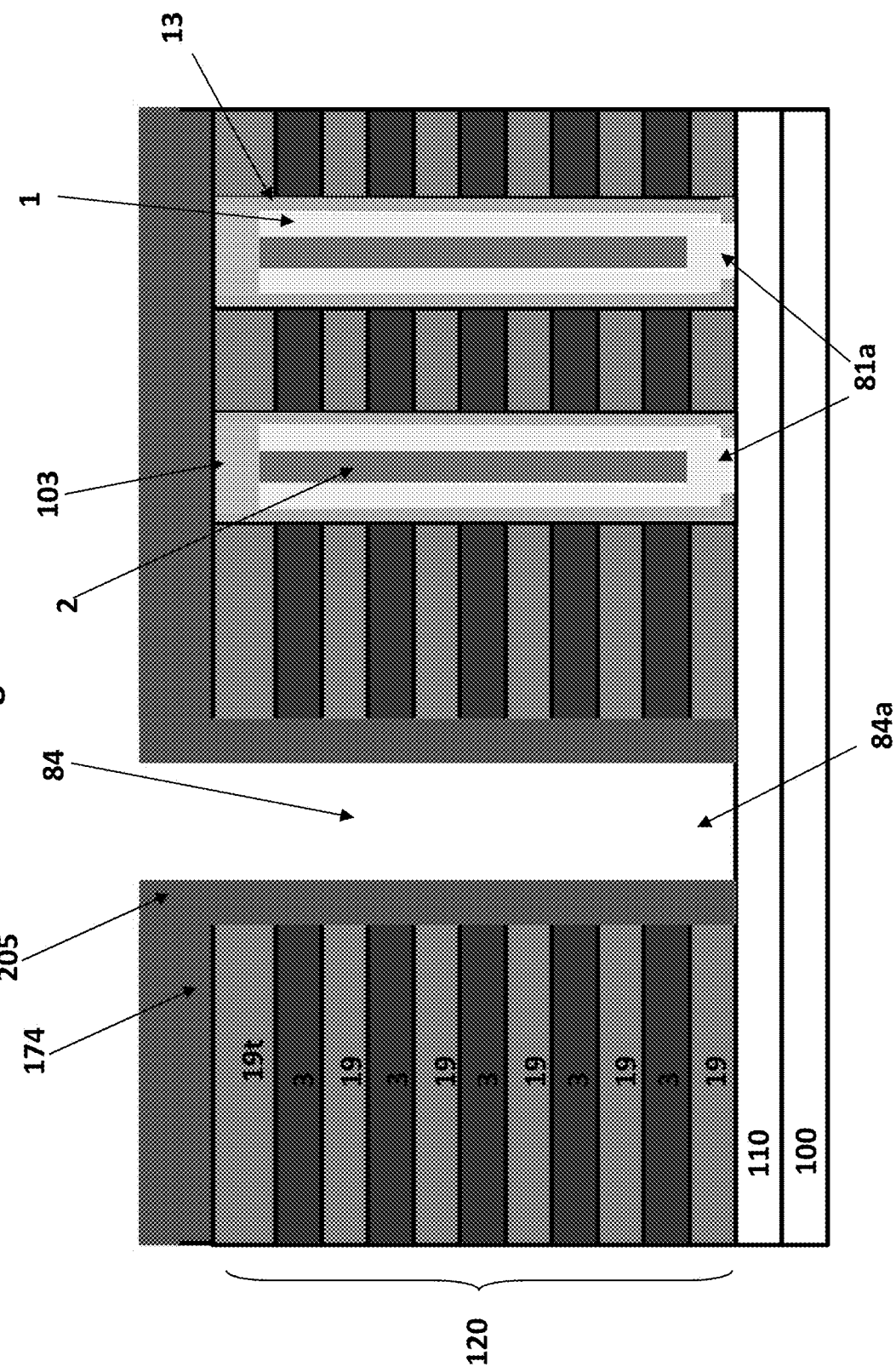

The insulating layer 205, such as a silicon oxide layer, is formed on sidewalls and bottom of the back side trenches 84, as shown in FIG. 16. Layer 205 is also formed over layer 174. The insulating layer 205 is then removed from the bottom 84a of the back side trench 84 by anisotropic etching (e.g., by RIE spacer etch) without removing the insulating layer from the sidewalls of the trench 84, as shown in FIG. 17. This etching step exposes p-well 110 through the bottom 84a of the trench 84.

Figure 18:
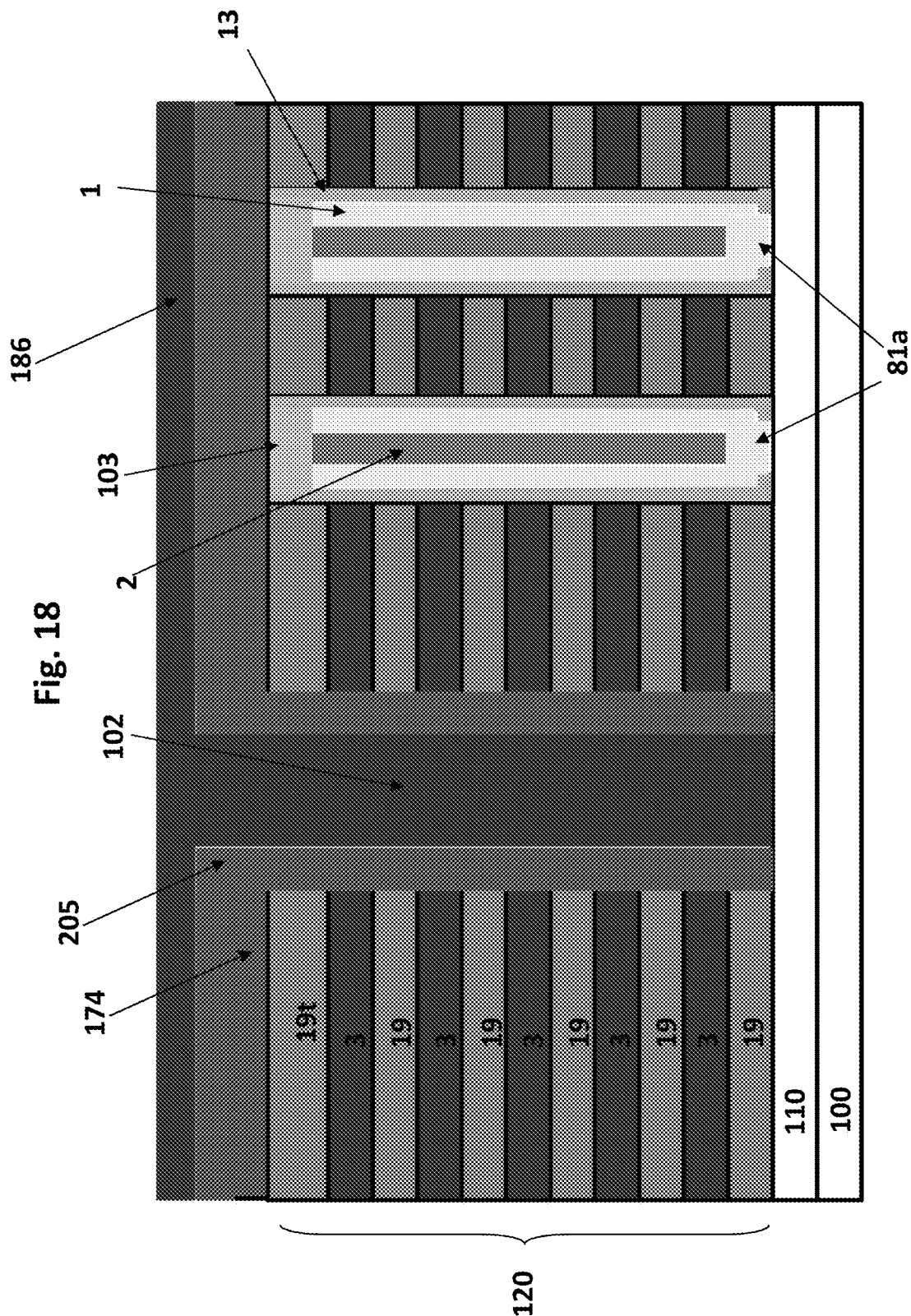
Figure 19:
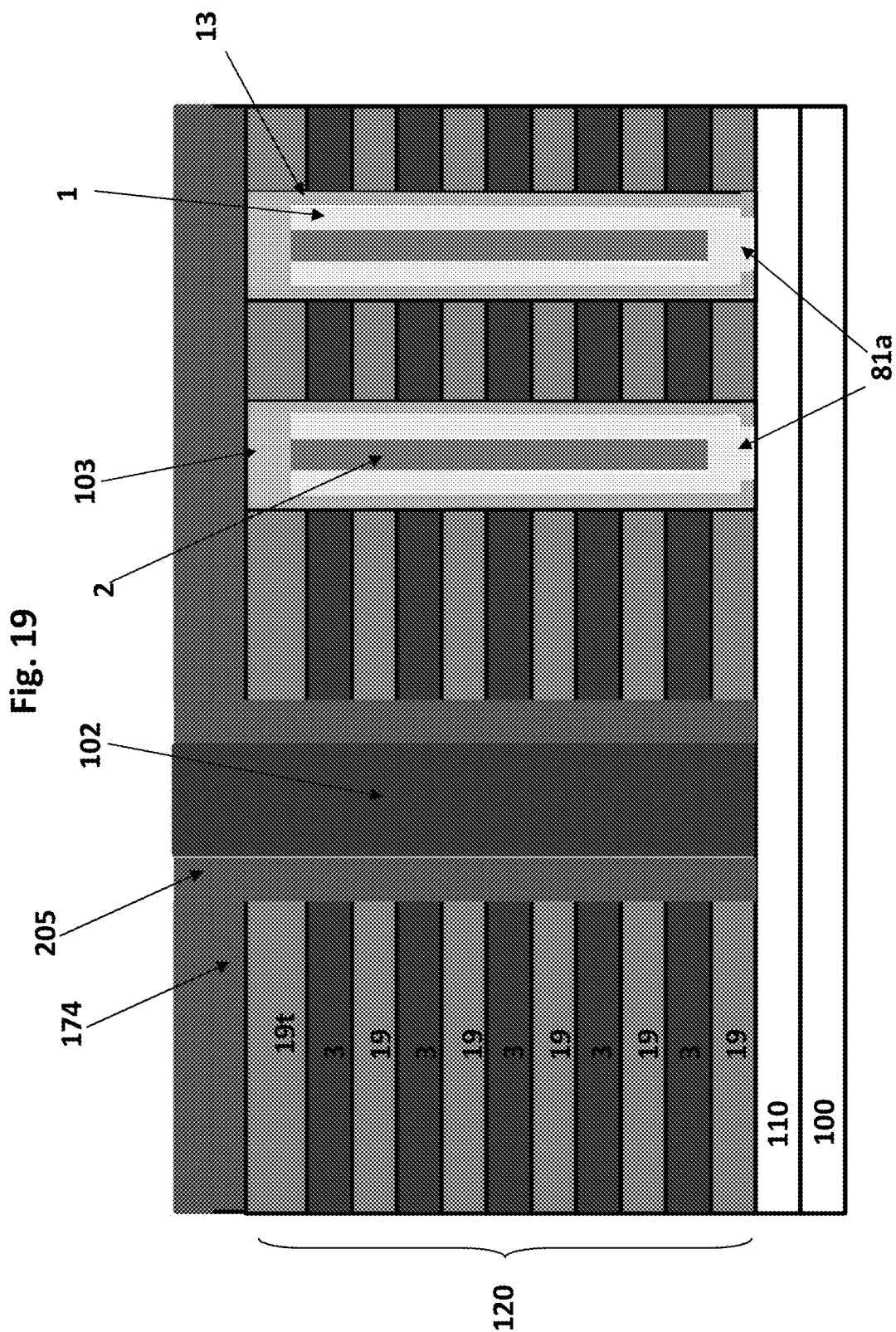

The source electrode 102 is then formed in the back side trench 84 in contact with the source region in the p-well 110 in the substrate 100, as shown in FIG. 18. The source electrode 102 may be formed by depositing any suitable metal or metal alloy layers, such as TiN, ruthenium, and/or tungsten over layer 205 in the trenches 84. A portion 186 of the source electrode material located over the device is removed by CMP or etching to leave the source electrode 102 in the dielectrically insulated trenches 84, as shown in FIG. 19.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A monolithic three dimensional NAND string device, comprising:
   a semiconductor channel, at least one end portion of the semiconductor channel extending substantially perpendicular to a major surface of a substrate, wherein the semiconductor channel comprises a hollow body surrounding a middle region;
   at least one of an air gap or a low-k insulating material having a dielectric constant of less than 3.9 located in the middle region;
   a plurality of control gate electrodes extending substantially parallel to the major surface of the substrate, wherein the plurality of control gate electrodes comprise at least a first control gate electrode located in a first device level and a second control gate electrode located in a second device level located over the major surface of the substrate and below the first device level;
   a blocking dielectric located in contact with the plurality of control gate electrodes;
   at least one charge storage region located in contact with the blocking dielectric; and
   a tunnel dielectric located between the at least one charge storage region and the semiconductor channel.

2. The device of claim 1, wherein:
   the middle region comprises a cylinder shaped region having an axis extending substantially perpendicular to the major surface of the substrate;
   the semiconductor channel comprises a hollow cylinder shaped channel surrounding the middle region;
   the tunnel dielectric comprises a cylinder which surrounds the semiconductor channel;
   the tunnel dielectric comprises a single insulating layer or a stack of a plurality of insulating layers comprised of different materials;
   the at least one charge storage region comprises a cylinder shaped plurality of vertically spaced apart floating gates or a cylinder shaped dielectric charge storage layer which surrounds the tunnel dielectric;
   the blocking dielectric comprises a cylinder which surrounds the at least one charge storage region;
   the blocking dielectric comprises a single insulating layer or a stack of a plurality of insulating layers comprised of different materials; and
   the first and the second control gate electrodes surround the blocking dielectric.

3. The device of claim 2, wherein:
   the substrate comprises a silicon substrate;
   the monolithic three dimensional NAND string is located in a monolithic, three dimensional array of NAND strings located over the silicon substrate;
   at least one memory cell in the first device level of the three dimensional array of NAND strings is located over another memory cell in the second device level of the three dimensional array of NAND strings; and
   the silicon substrate contains an integrated circuit comprising a driver circuit for the memory device located thereon.

4. The device of claim 1, wherein the air gap is located in the middle region.

5. The device of claim 4, wherein the air gap fills the entire middle region.

6. The device of claim 4, further comprising an insulating material located in a core of the middle region, wherein the air gap surrounds the insulating material.

7. The device of claim 4, wherein the air gap is located in a core of the middle region, and further comprising the low-k insulating material surrounding the air gap in the middle region.

8. The device of claim 4, further comprising an insulating air bridge layer located over the air gap in the middle region and a doped semiconductor drain region located in electrical contact with an upper portion of the semiconductor channel layer over the insulating air bridge layer.

9. The device of claim 4, further comprising a semiconductor drain air bridge layer located over the air gap in the middle region.

10. The device of claim 1, wherein the low-k insulating material is located in the middle region.

11. The device of claim 10, wherein the low-k insulating material fills the entire middle region and the low-k insulating material has the dielectric constant of 1.1 to 3.3.

12. The device of claim 11, wherein the low-k insulating material is selected from a group consisting of doped silicon oxide, organic insulating material, hybrid organic/inorganic insulating material, or porous insulating material.

13. The device of claim 12, wherein:
   the doped silicon oxide is selected from at least one of carbon, fluorine and hydrogen doped oxide;
   the organic insulating material is selected from a group consisting of polyimide, aromatic polymer, parylene, fluorine-doped amorphous carbon, PTFE, Poly(arylene ether), diamond-like carbon, or fluorine-doped diamond-like carbon;
   the hybrid organic/inorganic insulating material comprises hydrogen doped silicon carbide, hydrogen doped silicon oxycarbide, silicon carbonitride, or methylsilsesquioxane (MSQ)-based amorphous SiOC:H polymer; or
   the porous insulating material comprises an aerogel or a xerogel material.

14. The device of claim 10, further comprising silicon oxide or high-k insulating material having a dielectric constant of 3.9 or higher located in a core of the middle region, wherein the low-k insulating material surrounds the silicon oxide or high-k insulating material in the middle region.

15. A method of making a monolithic three dimensional NAND string, comprising:
   forming a stack of alternating layers of a first material and a second material different from the first material over a substrate;
   etching the stack to form at least one opening in the stack;
   forming a blocking dielectric layer in the at least one opening;
   forming at least one charge storage region in the at least one opening;
   forming a tunnel dielectric layer in the at least one opening;
   forming a hollow semiconductor channel layer surrounding a middle region in the at least one opening; and
   forming at least one of an air gap or a low-k insulating material having a dielectric constant of less than 3.9 located in the middle region.

16. The method of claim 15, wherein:
the at least one opening comprises a front side opening;
forming the blocking dielectric layer comprises forming the blocking dielectric layer in the front side opening;
forming the at least one charge storage region comprises forming the at least one charge storage region over the blocking dielectric layer in the front side opening;
forming the tunnel dielectric layer comprises forming the tunnel dielectric layer over the at least one charge storage region in the front side opening;
forming the hollow semiconductor channel layer comprises forming the semiconductor channel layer over the tunnel dielectric layer in the front side opening; and
forming the at least one of the air gap or the low-k insulating material comprises forming the at least one of the air gap or the low-k insulating material in the middle region in the front side opening.

17. The method of claim 16, wherein:
the first material layers comprise insulating layers; and
the second material layers comprise doped semiconductor or electrically conductive control gate layers.

18. The method of claim 15, wherein:
the at least one opening comprises a front side opening and a back side opening;
forming the blocking dielectric layer comprises forming the blocking dielectric layer in the back side opening;
forming the at least one charge storage region comprises at least one of forming the at least one charge storage region in the back side opening or forming the at least one charge storage region in the front side opening;
forming the tunnel dielectric layer comprises forming the tunnel dielectric layer over the at least one charge storage region in the front side opening;
forming the hollow semiconductor channel layer comprises forming the semiconductor channel layer over the tunnel dielectric layer in the front side opening; and
forming the at least one of the air gap or the low-k insulating material comprises forming the at least one of the air gap or the low-k insulating material in the middle region in the front side opening.

19. The method of claim 18, wherein:
the first material layers comprise insulating layers; and
the second material layers comprise sacrificial layers.

20. The method of claim 19, further comprising:
removing the sacrificial layers through the back side opening to form back side recesses;
forming the blocking dielectric layer in the back side recesses through the back side opening; and
forming electrically conductive control gate layers over the blocking dielectric layer in the back side recesses through the back side opening.

21. The method of claim 15, wherein:
the middle region comprises a cylinder shaped region having an axis extending substantially perpendicular to the major surface of the substrate;
the semiconductor channel layer comprises a hollow cylinder shaped channel surrounding a sidewall of the middle region;
the tunnel dielectric layer comprises a cylinder which surrounds the semiconductor channel layer;
the tunnel dielectric layer comprises a single insulating layer or a stack of a plurality of insulating sublayers comprised of different materials;
the at least one charge storage region comprises a cylinder which surrounds the tunnel dielectric layer;
the blocking dielectric layer comprises a cylinder which surrounds the at least one charge storage region;
the blocking dielectric comprises a single insulating layer or a stack of a plurality of insulating sublayers comprised of different materials; and
a plurality of control gate electrodes surround the blocking dielectric layer.

22. The method of claim 21, wherein the at least one charge storage region comprises a plurality of vertically spaced apart floating gates or a dielectric charge storage layer.

23. The method of claim 15, wherein the air gap is located in the middle region.

24. The method of claim 23, wherein the air gap fills the entire middle region.

25. The method of claim 23, further comprising:
forming a hollow sacrificial material over the semiconductor channel layer in the at least one opening;
forming an insulating material layer located in a hollow core portion of the hollow sacrificial material; and
selectively removing the hollow sacrificial material to leave the air gap between the semiconductor channel layer and the insulating material layer such that the air gap surrounds the insulating material layer.

26. The method of claim 23, further comprising forming the low-k insulating material over the semiconductor channel layer in the at least one opening such that the low-k insulating material forms a hollow cylinder having the air gap remaining in a core of the middle region.

27. The method of claim 23, further comprising:
forming a sacrificial material over the semiconductor channel layer in the at least one opening such that the sacrificial material exposes an upper portion of the semiconductor channel layer;
forming a hollow first insulating layer over the sacrificial material such that the hollow first insulating layer narrows a width of the at least one opening and exposes an upper portion of the sacrificial material below and an upper portion of the semiconductor channel layer above;
selectively removing the sacrificial material to leave the hollow first insulating layer suspended in the at least one opening;
forming a second insulating air bridge layer over the hollow first insulating layer to leave the air gap in the middle region of the at least one opening below the second insulating air bridge layer and to expose the upper portion of the semiconductor channel layer; and
forming a doped semiconductor drain region in electrical contact with the upper portion of the semiconductor channel layer over the second insulating air bridge layer.

28. The method of claim 27, wherein forming the second insulating air bridge layer to expose the upper portion of the semiconductor channel layer comprises recessing the second insulating air bridge layer or forming the second insulating air bridge layer only over the hollow first insulating layer without covering the upper portion of the semiconductor channel layer.

29. The method of claim 23, further comprising:
forming a non-conformal insulating air bridge layer over in the at least one opening to leave the air gap located below the non-conformal insulating air bridge layer in the at least one opening and to expose an upper portion of the semiconductor channel layer; and
forming a doped semiconductor drain region in electrical contact with the upper portion of the semiconductor channel layer over the non-conformal insulating air bridge layer.

30. The method of claim 23, further comprising:
forming a sacrificial material over the semiconductor channel layer in the at least one opening such that the sacrificial material exposes an upper portion of the semiconductor channel layer;
forming a hollow first layer over the sacrificial material such that the hollow first layer narrows a width of the at least one opening and exposes an upper portion of the sacrificial material below and an upper portion of the semiconductor channel layer above;
selectively removing the sacrificial material to leave the hollow first layer suspended in the at least one opening; and
forming a semiconductor drain air bridge layer in electrical contact with the upper portion of the semiconductor channel layer and over the hollow first layer to leave the air gap in the middle region of the at least one opening below the semiconductor drain air bridge layer.

31. The method of claim 23, further comprising forming a non-conformal semiconductor drain air bridge layer in electrical contact with an upper portion of the semiconductor channel layer in the at least one opening to leave the air gap located below the semiconductor drain air bridge layer in the at least one opening.

32. The method of claim 15, wherein the low-k insulating material is located in the middle region.

33. The method of claim 32, wherein the low-k insulating material fills the entire middle region and the low-k insulating material has the dielectric constant of 1.1 to 3.3.

34. The method of claim 33, wherein the low-k insulating material is selected from a group consisting of doped silicon oxide, organic insulating material, hybrid organic/inorganic insulating material, or porous insulating material.

35. The method of claim 34, wherein:
the doped silicon oxide is selected from at least one of carbon, fluorine and hydrogen doped oxide;
the organic insulating material is selected from a group consisting of polyimide, aromatic polymer, parylene, fluorine-doped amorphous carbon, PTFE, Poly(arylene ether), diamond-like carbon, or fluorine-doped diamond-like carbon;
the hybrid organic/inorganic insulating material comprises hydrogen doped silicon carbide, hydrogen doped silicon oxycarbide, silicon carbonitride, or methylsilsesquioxane (MSQ)-based amorphous SiOC:H polymer; or
the porous insulating material comprises an aerogel or a xerogel material.

36. The method of claim 32, further comprising forming silicon oxide or a high-k insulating material having a dielectric constant of 3.9 or higher over the low-k insulating material in the at least one opening, such that the silicon oxide or high-k insulating material is located in a core of the middle region, and the low-k insulating material surrounds the silicon oxide high-k insulating material in the middle region.

37. The method of claim 15, further comprising forming an epitaxial silicon pillar over a single crystal silicon surface of the substrate and forming the semiconductor channel layer comprising an amorphous silicon or polysilicon layer in contact with the epitaxial silicon pillar, wherein the epitaxial silicon pillar comprises a lower portion of a semiconductor channel of the NAND string and the amorphous silicon or polysilicon layer comprises an upper portion of the semiconductor channel of the NAND string.

\* \* \* \* \*